United States Patent
Aida et al.

(10) Patent No.: US 9,455,229 B2
(45) Date of Patent: Sep. 27, 2016

(54) COMPOSITE SUBSTRATE MANUFACTURING METHOD, SEMICONDUCTOR ELEMENT MANUFACTURING METHOD, COMPOSITE SUBSTRATE, AND SEMICONDUCTOR ELEMENT

(71) Applicants: NAMIKI SEIMITSU HOUSEKI KABUSHIKIKAISHA, Adachi-ku, Tokyo (JP); DISCO CORPORATION, Ota-ku, Tokyo (JP)

(72) Inventors: Hideo Aida, Tokyo (JP); Natsuko Aota, Tokyo (JP); Hidetoshi Takeda, Tokyo (JP); Keiji Honjo, Tokyo (JP); Hitoshi Hoshino, Tokyo (JP); Mai Ogasawara, Tokyo (JP)

(73) Assignees: NAMIKI SEIMITSU HOUSEKI KABUSHIKI KAISHA, Tokyo (JP); DISCO CORPORATION, Tokyo (JP)

( * ) Notice: Subject to any disclaimer, the term of this patent is extended or adjusted under 35 U.S.C. 154(b) by 0 days.

(21) Appl. No.: 14/397,400
(22) PCT Filed: Apr. 24, 2013
(86) PCT No.: PCT/JP2013/062125
§ 371 (c)(1),
(2) Date: Oct. 27, 2014
(87) PCT Pub. No.: WO2013/161906
PCT Pub. Date: Oct. 31, 2013

(65) Prior Publication Data
US 2015/0076662 A1  Mar. 19, 2015

(30) Foreign Application Priority Data
Apr. 27, 2012 (JP) .................................. 2012-103647

(51) Int. Cl.
*H01L 23/00* (2006.01)
*H01L 21/70* (2006.01)
(Continued)

(52) U.S. Cl.
CPC ......... *H01L 23/562* (2013.01); *B23K 26/0057* (2013.01); *B23K 26/0093* (2013.01);
(Continued)

(58) Field of Classification Search
CPC . H01L 21/67288; H01L 22/12; H01L 24/83; H01L 23/562; B23K 26/0736
USPC ........................................... 438/457; 257/615
See application file for complete search history.

(56) References Cited

U.S. PATENT DOCUMENTS 5,907,770 A * 5/1999 Yamazaki ........... H01L 21/2026
257/E21.119
6,756,285 B1 * 6/2004 Moriceau ............ B81C 1/00666
257/E21.087

(Continued)

FOREIGN PATENT DOCUMENTS

EP  2405465 A1  1/2012
JP  2-135722 A  5/1990

(Continued)

OTHER PUBLICATIONS

PCT International Search Report for International Application No. PCT/JP2013/062125 mailed Aug. 6, 2013, with English translation.
(Continued)

*Primary Examiner* — Moazzam Hossain
(74) *Attorney, Agent, or Firm* — Cantor Colburn LLP

(57) ABSTRACT

Provided is a composite substrate manufacturing method, including at least: a first raw board deforming step of preparing a first substrate by deforming a first raw board having at least one surface as a minor surface into a state in which the minor surface warps outward; and a joining step of joining, after the first raw board deforming step, a protruding surface of the first substrate and one surface of a second substrate to each other, thereby manufacturing a composite substrate including the first substrate and the second substrate, in which the second substrate is any one substrate selected from a substrate having both surfaces as substantially flat surfaces and a substrate that warps so that a surface thereof to be joined to the first substrate warps outward. Also provided are a semiconductor element manufacturing method, a composite substrate and a semiconductor element manufactured.

6 Claims, 16 Drawing Sheets

(51) Int. Cl.
  *H01L 21/18* (2006.01)
  *H01L 21/02* (2006.01)
  *H01L 21/78* (2006.01)
  *H01L 21/302* (2006.01)
  *B23K 26/00* (2014.01)
  *B23K 26/40* (2014.01)
  *H01L 33/00* (2010.01)

(52) U.S. Cl.
  CPC ........... *B23K26/0624* (2015.10); *B23K 26/40* (2013.01); *H01L 21/02005* (2013.01); *H01L 21/0254* (2013.01); *H01L 21/187* (2013.01); *H01L 21/302* (2013.01); *H01L 21/707* (2013.01); *H01L 21/7806* (2013.01); *H01L 24/83* (2013.01); *B23K 2203/50* (2015.10); *B23K 2203/52* (2015.10); *H01L 33/0079* (2013.01); *H01L 2224/8385* (2013.01); *H01L 2224/83385* (2013.01); *H01L 2224/83868* (2013.01); *H01L 2224/83871* (2013.01); *H01L 2224/83874* (2013.01); *H01L 2924/0544* (2013.01); *H01L 2924/05432* (2013.01); *H01L 2924/1033* (2013.01); *H01L 2924/10253* (2013.01); *H01L 2924/10254* (2013.01); *H01L 2924/10272* (2013.01); *H01L 2924/10329* (2013.01); *H01L 2924/12042* (2013.01); *H01L 2924/40102* (2013.01); *H01L 2924/40501* (2013.01); *H01L 2924/40502* (2013.01); *H01L 2924/40503* (2013.01); *Y10T 428/24628* (2015.01)

(56) References Cited

U.S. PATENT DOCUMENTS

| | | | | |
|---|---|---|---|---|
| 8,034,208 | B2* | 10/2011 | Moriceau | H01F 10/24 156/249 |
| 8,916,456 | B2* | 12/2014 | Faurie | H01L 21/3245 257/615 |
| 2004/0221799 | A1* | 11/2004 | Nakayama | B24B 37/08 117/94 |
| 2005/0048241 | A1* | 3/2005 | Terada | B08B 7/0028 428/40.1 |
| 2006/0159930 | A1* | 7/2006 | Ishizuka | C09J 5/06 428/414 |
| 2007/0224522 | A1* | 9/2007 | Lee | G03F 1/14 430/5 |
| 2008/0003708 | A1* | 1/2008 | Hoshino | B23K 26/0057 438/33 |
| 2008/0194079 | A1* | 8/2008 | Yamamoto | B28D 1/221 438/462 |
| 2009/0309191 | A1* | 12/2009 | Theuss | H01L 21/0201 257/618 |
| 2010/0003830 | A1* | 1/2010 | Itoh | B29C 35/0894 438/758 |
| 2010/0009547 | A1* | 1/2010 | Sakamoto | B23K 26/0057 438/795 |
| 2010/0173472 | A1 | 7/2010 | Nagano | |
| 2012/0006463 | A1 | 1/2012 | Gaudin | |
| 2013/0161757 | A1* | 6/2013 | Huang | H01L 21/823878 257/369 |
| 2013/0210171 | A1 | 8/2013 | Gaudin | |
| 2013/0337213 | A1* | 12/2013 | Smithson | B41M 5/267 428/41.8 |
| 2014/0004713 | A1* | 1/2014 | Igeta | H01L 21/0228 438/775 |
| 2015/0348933 | A1 | 12/2015 | Gaudin | |

FOREIGN PATENT DOCUMENTS

| | | |
|---|---|---|
| JP | 5-275300 A | 10/1993 |
| JP | 2009-177034 A | 8/2009 |

OTHER PUBLICATIONS

Extended European Search Report corresponding to Application No. 13782105.4-1555/2843687 dated Nov. 23, 2015.

* cited by examiner

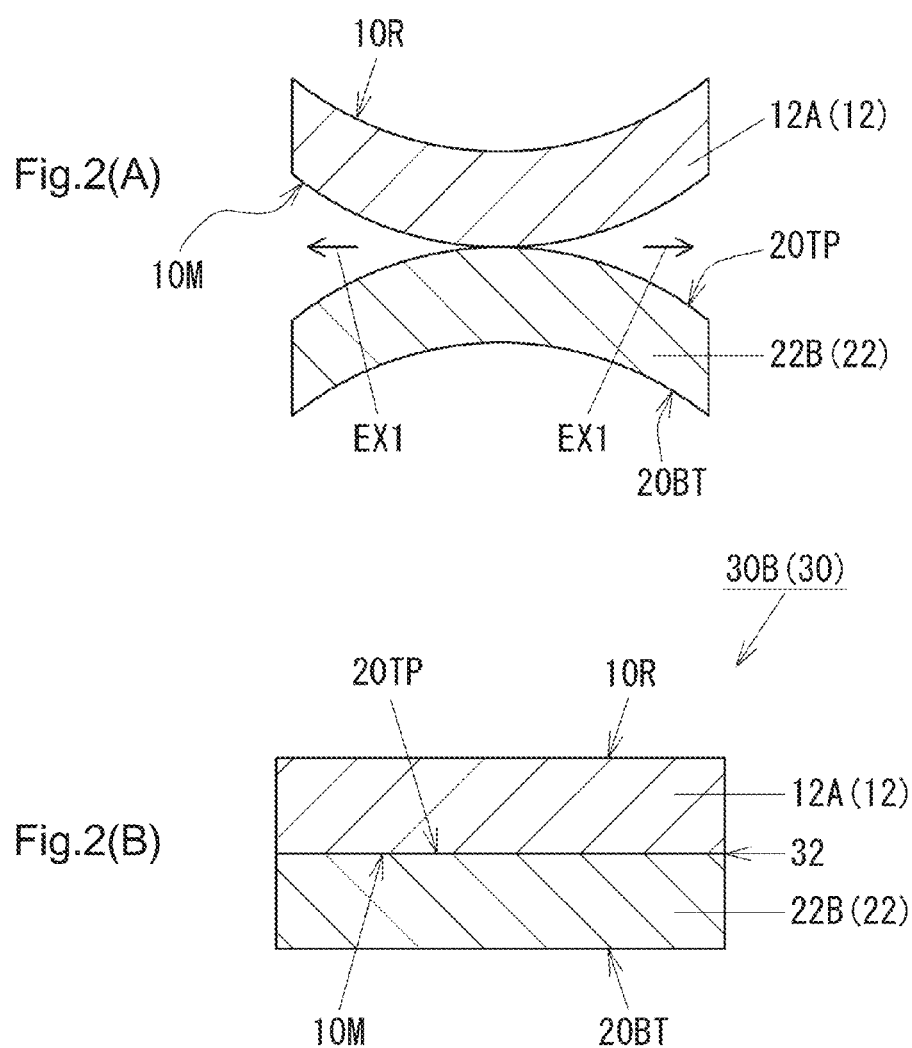

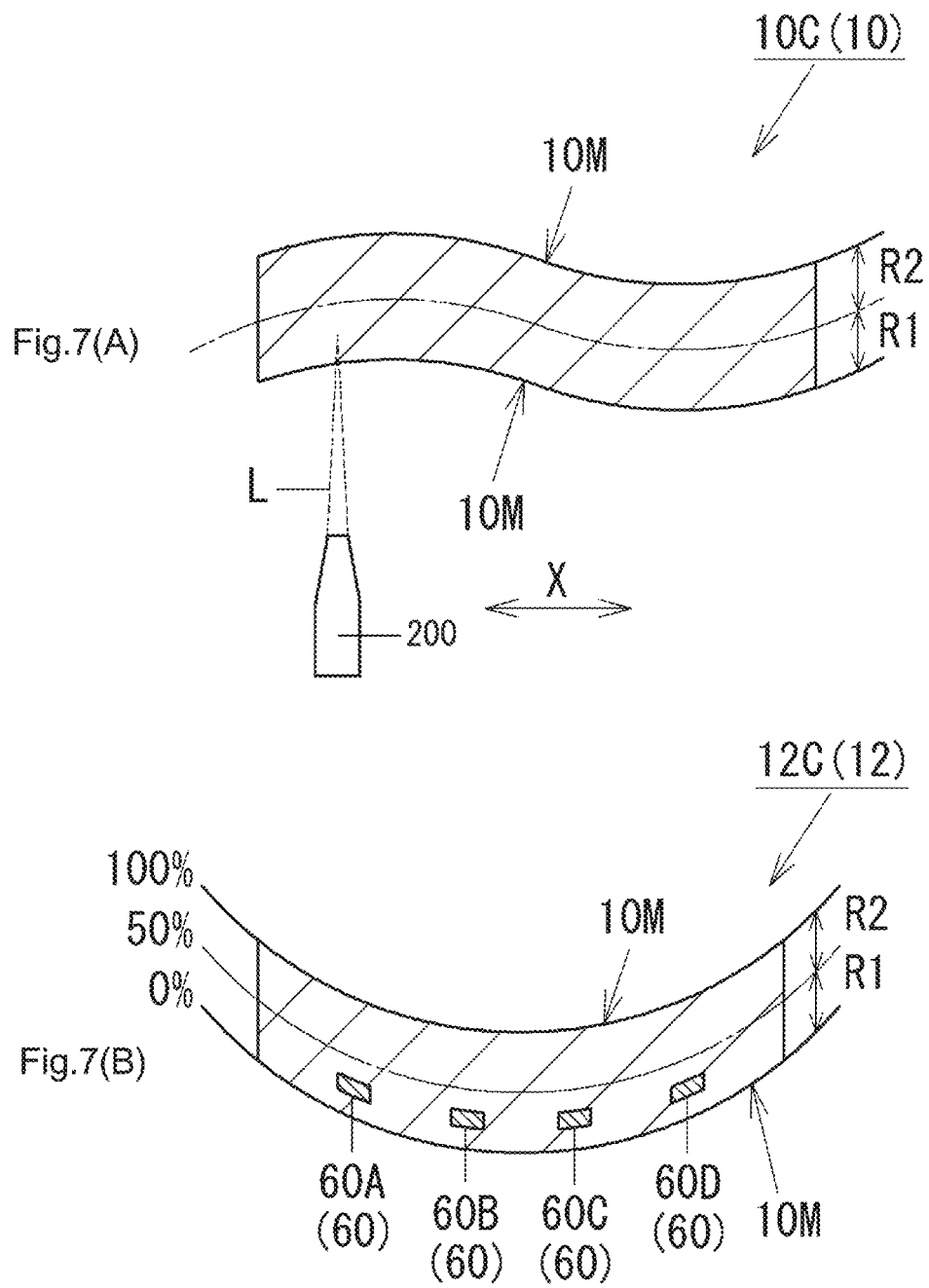

W

COMPOSITE SUBSTRATE MANUFACTURING METHOD, SEMICONDUCTOR ELEMENT MANUFACTURING METHOD, COMPOSITE SUBSTRATE, AND SEMICONDUCTOR ELEMENT

CROSS REFERENCE TO RELATED APPLICATIONS

This is the U.S. national stage of application No. PCT/JP2013/062125, filed on 24 Apr. 2013. Priority under 35 U.S.C. §119(a) and 35 U.S.C. §365(b) is claimed from Japanese Application No. 2012-103647, filed 27 Apr. 2012, the disclosure of which is also incorporated herein by reference.

TECHNICAL FIELD

The present invention relates to a composite substrate manufacturing method, a semiconductor element manufacturing method, a composite substrate, and a semiconductor element.

BACKGROUND ART

When various kinds of elements and devices such as a semiconductor element are manufactured, a composite substrate formed by joining two substrates to each other may be used in some cases. For example, when a semiconductor wafer level package is manufactured, a composite substrate formed by joining a semiconductor wafer and a support substrate to each other is used (Patent Literature 1). In this technology, in a semiconductor wafer or a support substrate forming the composite substrate, a cut line having a certain depth from a surface thereof is formed. Therefore, in a processing step after the cut line is formed, stress applied to the semiconductor wafer and/or a cap wafer is alleviated by the cut line. As a result, a warpage amount of the composite substrate is greatly reduced, and thus, in semiconductor processes after the cut line is formed, occurrence of various kinds of troubles such as an error in transporting the composite substrate, lowering of product yields, and the like can be inhibited.

CITATION LIST

Patent Literature

[PTL 1] JP 2009-177034 A (claim 1, paragraphs 0010, 0012, and the like)

SUMMARY OF INVENTION

Technical Problem

When a semiconductor element or the like is manufactured using a composite substrate as disclosed in Patent Literature 1, it is often desired that a joining surface of at least one substrate (first substrate) of the substrates that form the composite substrate be mirror polished. On the other hand, from the viewpoint of cost, it is preferred that only one surface of the first substrate be mirror polished. In this case, in a state illustrated in FIG. 13(A) before the joining, a first substrate 110A (110) including a surface 110RP, which is not mirror polished but is rough polished, warps so that a mirror polished surface 110MP thereof warps inward. Therefore, when the first substrate 110A and another substrate (second substrate 120) are joined to each other under a condition in which the mirror polished surface 110MP of the first substrate 110A is a joining surface, a void V is liable to appear on a joined interface 102 of a composite substrate 100A (100) (FIG. 13(B)). Therefore, when the void V appears on the joined interface 102, the void V may be responsible for lowered quality and lowered yields of an end product such as a semiconductor element manufactured using the composite substrate 100A.

In order to avoid such a problem, it is desired to use, in a state illustrated in FIG. 14(A) before the joining, a first substrate 110B (110) having both surfaces as mirror polished surfaces 110MPA and 110MPB. However, in this case, the cost of polishing significantly increases. In addition to this, even when both the surfaces of the first substrate 110B are uniformly minor polished, both the surfaces 110MPA and 110MPB of the first substrate 110B (110) are theoretically completely flat surfaces, but actually include minute undulations due to non-uniform polishing. Therefore, a possibility remains that, due to such minute undulations, the void V appears on the joined interface 102 of a composite substrate 100B (100) (FIG. 14(B)). Specifically, even when both the surfaces of the first substrate 110B are mirror polished, appearance of the void V on the joined interface 102 cannot be sufficiently inhibited, and in addition, the cost increases. Note that, in FIG. 13 and FIG. 14, a substrate having both flat surfaces is used as the second substrate 120, but, even when a substrate having warpage is used as the second substrate 120, the above-mentioned problem can arise.

The present invention has been made in view of the above-mentioned circumstances, and it is an object of the present invention to provide a composite substrate manufacturing method capable of inhibiting appearance of a void (void due to a surface shape of a substrate) on a joined interface, a semiconductor element manufacturing method using the composite substrate manufacturing method, and a composite substrate and a semiconductor element manufactured using the composite substrate manufacturing method.

Solution to Problem

The above-mentioned object is achieved by embodiments of the present invention to be described below.

A composite substrate manufacturing method according to the present invention includes at least: a first raw board deforming step of preparing a first substrate by deforming a first raw board having at least one surface as a mirror surface into a state in which the mirror surface warps outward; and a joining step of joining, after the first raw board deforming step, a protruding surface of the first substrate and one surface of a second substrate to each other, thereby manufacturing a composite substrate including the first substrate and the second substrate joined to the first substrate, in which the second substrate is any one substrate selected from a substrate having both surfaces as substantially flat surfaces and a substrate that warps so that a surface thereof to be joined to the first substrate warps outward.

In the composite substrate manufacturing method according to one embodiment of the present invention, it is preferred that the first raw board deforming step be carried out through irradiation of a laser to the first raw board focusing on, of two regions formed by dividing the first raw board into two in a thickness direction, an inside of a region of the first raw board on a side to be joined to the second substrate after the first raw board becomes the first substrate through the first raw board deforming step, thereby forming a heat denatured layer in the region.

In the composite substrate manufacturing method according to another embodiment of the present invention, it is preferred that the second substrate in a state in which a surface thereof to be joined to the first substrate warps outward be manufactured through a second raw board deforming step of deforming a second raw board having at least one surface as a mirror surface into a state in which the mirror surface warps outward.

In the composite substrate manufacturing method according to another embodiment of the present invention, it is preferred that the second raw board deforming step be carried out through irradiation of a laser to the second raw board focusing on, of two regions formed by dividing the second raw board into two in a thickness direction, an inside of a region of the second raw board on a side to be joined to the first substrate after the second raw board becomes the second substrate through the second raw board deforming step, thereby forming a heat denatured layer in the region.

In the composite substrate manufacturing method according to another embodiment of the present invention, it is preferred that irradiation of the laser be carried out so as to satisfy any one set of irradiation conditions selected from the following irradiation conditions A, irradiation conditions B, and irradiation conditions C.
<Irradiation Conditions A>
  Laser Wavelength: 200 nm to 400 nm
  Pulse Width: order of nanoseconds
<Irradiation Conditions B>
  Laser Wavelength: 350 nm to 2,000 nm
  Pulse Width: order of femtoseconds to order of picoseconds
<Irradiation Conditions C>
  Laser Wavelength: 1,000 nm to 1,600 nm
  Pulse Width: order of nanoseconds In the composite substrate manufacturing method according to another embodiment of the present invention, it is preferred that the first raw board have one surface as a mirror surface and another surface as a rough surface, and that the first raw board be any one raw board selected from the group consisting of: (1) a raw board that warps inward on the mirror surface side with a curvature in a range of 7.3 $km^{-1}$ or more and 30 $km^{-1}$ or less; and (2) a raw board having both surfaces as substantially flat surfaces.

In the composite substrate manufacturing method according to another embodiment of the present invention, it is preferred that the second raw board have one surface as a mirror surface and another surface as a rough surface, and that the second raw board be any one raw board selected from the group consisting of: (1) a raw board that warps inward on the mirror surface side with a curvature in a range of 7.3 $km^{-1}$ or more and 30 $km^{-1}$ or less; and (2) a raw board having both surfaces as substantially flat surfaces.

In the composite substrate manufacturing method according to another embodiment of the present invention, it is preferred that a material of at least one substrate selected from the first substrate and the second substrate be any one material selected from sapphire, a nitride semiconductor, Si, GaAs, quartz, SiC, and diamond.

In the composite substrate manufacturing method according to another embodiment of the present invention, it is preferred that at least one substrate selected from the first substrate and the second substrate have a diameter of 50 mm or more and 450 mm or less, and a thickness of 0.2 mm or more and 2.0 mm or less.

A first semiconductor element manufacturing method according to the present invention includes at least: a first raw board deforming step of preparing a first substrate by deforming a first raw board having at least one surface as a mirror surface into a state in which the mirror surface warps outward; a joining step of joining, after the first raw board deforming step, a protruding surface of the first substrate and one surface of a second substrate to each other, thereby manufacturing a composite substrate including the first substrate and the second substrate joined to the first substrate; and a thin film forming step of thereafter forming a thin film including one or more semiconductor layers on at least one surface of the composite substrate, thereby manufacturing a semiconductor element including the first substrate, the second substrate joined to the first substrate, and the one or more semiconductor layers, in which the second substrate is any one substrate selected from a substrate having both surfaces as substantially flat surfaces and a substrate that warps so that a surface thereof to be joined to the first substrate warps outward.

In the first semiconductor element manufacturing method according to one embodiment of the present invention, it is preferred that the second substrate in a state in which a surface thereof to be joined to the first substrate warps outward be manufactured through a second raw board deforming step of deforming a second raw board having at least one surface as a mirror surface into a state in which the mirror surface warps outward.

A second semiconductor element manufacturing method according to the present invention includes at least: a first raw board deforming step of preparing a first substrate by deforming a first raw board having at least one surface as a mirror surface into a state in which the mirror surface warps outward; and a joining step of joining, after the first raw board deforming step, a protruding surface of the first substrate and one surface of a second substrate to each other through intermediation of a thin film including one or more semiconductor layers, thereby manufacturing a semiconductor element including the first substrate and the second substrate joined to the first substrate through intermediation of the thin film, in which the second substrate is any one substrate selected from a substrate having both surfaces as substantially flat surfaces and a substrate that warps so that a surface thereof to be joined to the first substrate warps outward.

In the second semiconductor element manufacturing method according to one embodiment of the present invention, it is preferred that the second substrate in a state in which a surface thereof to be joined to the first substrate warps outward be manufactured through a second raw board deforming step of deforming a second raw board having at least one surface as a mirror surface into a state in which the mirror surface warps outward.

In the first and second semiconductor element manufacturing methods according to another embodiment of the present invention, it is preferred that the thin film include at least one nitride semiconductor layer.

A composite substrate according to the present invention includes at least: a first substrate; and a second substrate, one surface of the first substrate and one surface of the second substrate being joined to each other, the one surface of the first substrate being a mirror surface, in which a heat denatured layer is formed in at least one region selected from a region on a side of the surface joined to the second substrate of two regions formed by dividing the first substrate into two in a thickness direction, and a region on a side of the surface joined to the first substrate of two regions formed by dividing the second substrate into two in a thickness direction.

In the composite substrate according to one embodiment of the present invention, it is preferred that the one surface of the second substrate be a mirror surface.

A first semiconductor element according to the present invention includes at least: a first substrate; a second substrate; and a thin film including one or more semiconductor layers, one surface of the first substrate and one surface of the second substrate being joined to each other, the thin film being formed on at least one surface selected from a surface of the first substrate opposite to a surface to which the second substrate is joined, and a surface of the second substrate opposite to a surface to which the first substrate is joined, the one surface of the first substrate being a mirror surface, in which a heat denatured layer is formed in at least one region selected from a region on a side of the surface joined to the second substrate of two regions formed by dividing the first substrate into two in a thickness direction, and a region on a side of the surface joined to the first substrate of two regions formed by dividing the second substrate into two in a thickness direction.

A second semiconductor element according to the present invention includes at least: a first substrate; a second substrate; and a thin film including one or more semiconductor layers, one surface of the first substrate and one surface of the second substrate being joined to each other through intermediation of the thin film, the one surface of the first substrate being a mirror surface, in which a heat denatured layer is formed in at least one region selected from a region on a side of the surface joined to the second substrate of two regions formed by dividing the first substrate into two in a thickness direction, and a region on a side of the surface joined to the first substrate of two regions formed by dividing the second substrate into two in a thickness direction.

In the first and second semiconductor elements according to one embodiment of the present invention, it is preferred that the one surface of the second substrate be a mirror surface.

In the first and second semiconductor elements according to another embodiment of the present invention, it is preferred that the thin film include at least one nitride semiconductor layer.

Advantageous Effects of Invention

According to one embodiment of the present invention, the composite substrate manufacturing method capable of inhibiting appearance of a void (void due to a surface shape of a substrate) on a joined interface, the semiconductor element manufacturing method using the same, and the composite substrate and the semiconductor element manufactured using the composite substrate manufacturing method can be provided.

BRIEF DESCRIPTION OF DRAWINGS

FIG. 1 are schematic sectional views illustrating an exemplary joining step in a composite substrate manufacturing method according to one embodiment of the present invention.

FIG. 2 are schematic sectional views illustrating another exemplary joining step in the composite substrate manufacturing method of this embodiment. FIG. 2(A) is a view illustrating a state immediately after the joining starts, and FIG. 2(B) is a view illustrating a state after the joining step is completed, in other words, another exemplary composite substrate of this embodiment.

FIG. 3 are schematic sectional views illustrating still another exemplary joining step in the composite substrate manufacturing method of this embodiment.

FIG. 5 are schematic sectional views illustrating an exemplary first raw board deforming step in the composite substrate manufacturing method of this embodiment.

FIG. 7 are schematic sectional views illustrating an exemplary first raw board deforming step in the composite substrate manufacturing method of this embodiment. FIG. 7(A) is a view illustrating irradiation of a laser to the first raw board in a state in which both surfaces thereof are mirror polished, and FIG. 7(B) is a view illustrating the first substrate after the laser irradiation processing is completed.

FIG. 8 are schematic sectional views illustrating an exemplary second raw board deforming step in the composite substrate manufacturing method of this embodiment.

FIG. 10 are plan views illustrating exemplary arrangement pattern shapes of a heat denatured layer with respect to a plane direction of the first substrate and the second substrate having the heat denatured layer formed therein.

FIG. 11 are schematic sectional views illustrating exemplary semiconductor elements of a first embodiment of the present invention manufactured using the composite substrate of this embodiment.

FIG. 13 are schematic sectional views illustrating a problem when a first substrate in which only one surface is mirror polished and a second substrate are joined to each other to manufacture a composite substrate.

FIG. 14 are schematic sectional views illustrating a problem when a first substrate in which both surfaces are mirror polished and a second substrate are joined to each other to manufacture a composite substrate.

DESCRIPTION OF EMBODIMENTS (Composite Substrate Manufacturing Method and Composite Substrate)

According to a composite substrate manufacturing method of the present invention, a composite substrate including a first substrate and a second substrate joined to the first substrate is manufactured through at least: a first raw board deforming step of preparing the first substrate by deforming a first raw board having at least one surface as a mirror surface into a state in which the mirror surface warps outward; and a joining step of joining, after the first raw board deforming step, a protruding surface of the first substrate and one surface of the second substrate to each other. In this case, as the second substrate, any one substrate selected from a substrate having both surfaces as substantially flat surfaces and a substrate that warps so that a surface thereof to be joined to the first substrate warps outward is used.

Figure 1A:
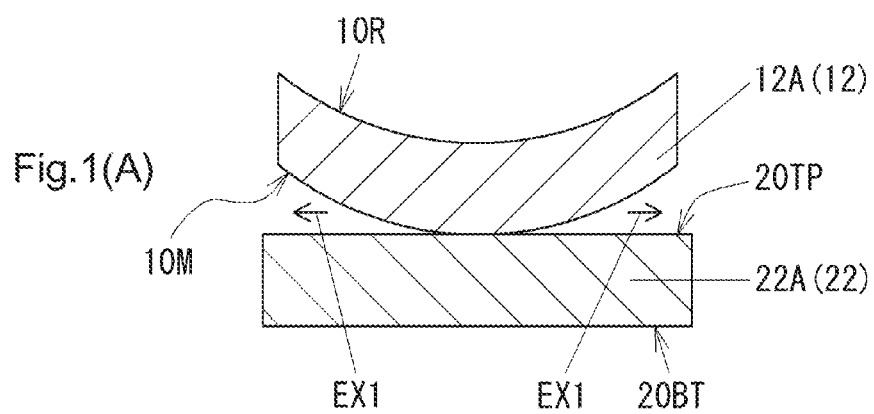
FIG. 1(A) is a view illustrating a state immediately after the joining starts.
Figure 1B:
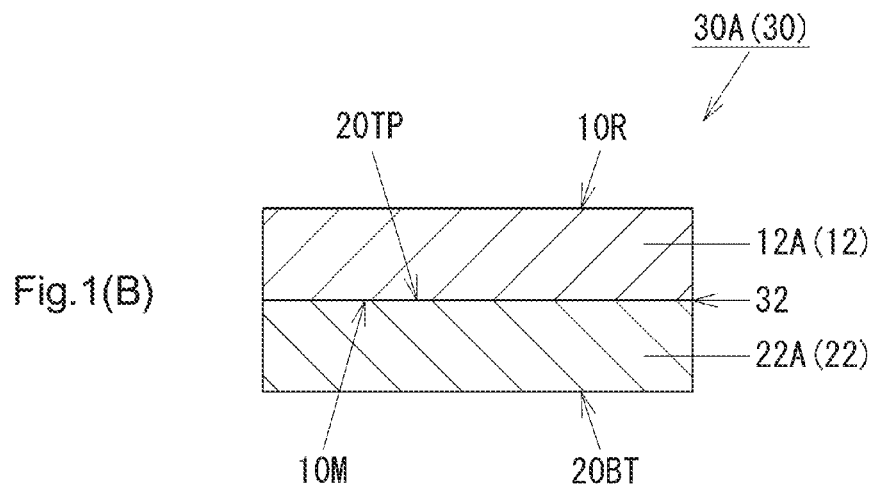
FIG. 1(B) is a view illustrating a state after the joining step is completed, in other words, an exemplary composite substrate of this embodiment.

FIG. 1 are schematic sectional views illustrating an exemplary joining step in a composite substrate manufacturing method of this embodiment, and specifically, illustrate a case where the joining step is carried out using a substrate having both surfaces as substantially flat surfaces as a second substrate. FIG. 2 are schematic sectional views illustrating an exemplary joining step in the composite substrate manufacturing method of this embodiment, and specifically, illustrate a case where the joining step is carried out using a substrate in which a surface to be joined to a first substrate warps outward as the second substrate. FIG. 1(A) and FIG. 2(A) illustrate states immediately after the joining step starts, and FIG. 1(B) and FIG. 2(B) illustrate states after the joining step is completed, in other words, composite substrates.

As illustrated in FIG. 1(A) and FIG. 1(B), one surface of a first substrate 12A (12) is a mirror surface 10M while the other surface is a rough surface 10R. The first substrate 12A warps so that the mirror surface 10M warps outward. Further, both surfaces of a second substrate 22A (22) illustrated in FIG. 1(B) (joining surface 20TP and non-joining surface 20BT) are substantially flat surfaces, and a second substrate 22B (22) illustrated in FIG. 2(B) warps so that one surface thereof (joining surface 20TP) warps outward.

In this case, as illustrated in FIG. 1(A) and FIG. 2(A), immediately after the joining step starts, a substantially center portion of the mirror surface 10M as a protruding surface of the first substrate 12A and a substantially center portion of the one surface of the second substrate 22 (joining surface 20TP) are brought into contact with each other. As the joining step proceeds, a contact region between the mirror surface 10M and the joining surface 20TP extends from the center portion side to a peripheral portion side of the first substrate 12A and the second substrate 22. When the joining step is completed, as illustrated in FIG. 1(B) and FIG. 2(B), the entire minor surface 10M and the entire joining surface 20TP are brought into contact with each other. In this way, a composite substrate 30A (30) including the first substrate 12A and the second substrate 22A as illustrated in FIG. 1(B), and a composite substrate 30B (30) including the first substrate 12A and the second substrate 22B as illustrated in FIG. 2(B) can be obtained.

When the joining step as illustrated in FIG. 1 and FIG. 2 is carried out, air, or fluid members such as air and an adhesive, which exist between the minor surface 10M as a protruding surface and the joining surface 20TP before the joining step starts are gradually pushed out in a direction from the substantially center portion side of the mirror surface 10M and the joining surface 20TP to the peripheral portion side thereof (in FIG. 1 and FIG. 2, in directions of arrows EX1). In other words, at the time of the joining, air is expelled to the outside without being entangled between the minor surface 10M and the joining surface 20TP without fail. Therefore, appearance of the void V as illustrated in FIG. 13 and FIG. 14 on a joined interface 32 between the first substrate 12 and the second substrate 22 that form the composite substrate 30 can be prevented, or, in the event that the void V appears, the size thereof can be restricted to be extremely small.

Figure 3A:
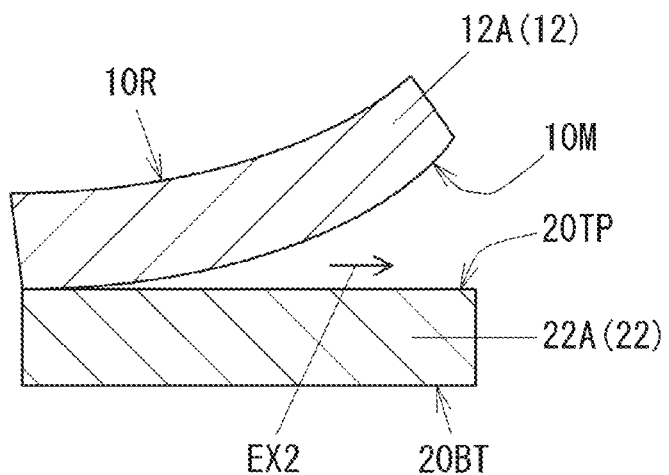
FIG. 3(A) is a view illustrating a state immediately after the joining starts.
Figure 3B:
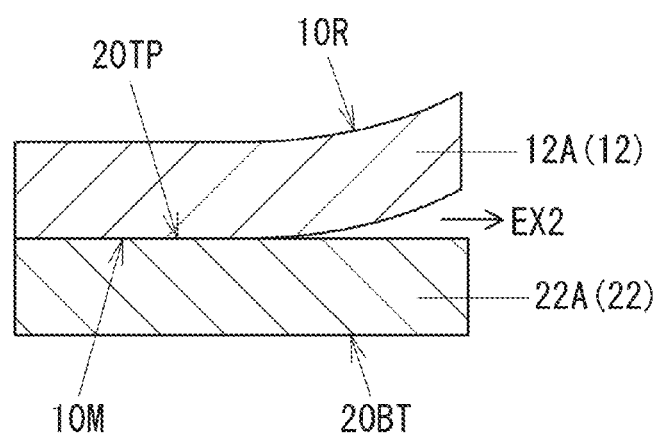
FIG. 3(B) is a view illustrating a state of a stage at which the joining further proceeds.

Note that, in the joining step illustrated in FIG. 1 and FIG. 2, first, the substantially center portion of the mirror surface 10M as a protruding surface and the substantially center portion of the joining surface 20TP are brought into contact with each other, and then, the first substrate 12A and the second substrate 22 are brought closer to and into contact with each other so that the contact portion spreads out. However, in the joining step, as illustrated in FIG. 3, first of all, one end side of the mirror surface 10M as a protruding surface and one end side of the joining surface 20TP may be brought into contact with each other (FIG. 3(A)), and after that, the first substrate 12A and the second substrate 22 may be brought closer to and into contact with each other so that the contact portion spreads from the center portion side to the other end side of the mirror surface 10M and the joining surface 20TP (FIG. 3(B)). In this case, air, or fluid members such as air and an adhesive, which exist between the mirror surface 10M as a protruding surface and the joining surface 20TP before the joining step starts are gradually pushed out in the direction from the one end side of the mirror surface 10M and the joining surface 20TP to the other end side thereof (in FIG. 3, in a direction of an arrow EX2). Therefore, also in this case, at the time of the joining, air is expelled to the outside without being entangled between the mirror surface 10M and the joining surface 20TP without fail.

Figure 13A:
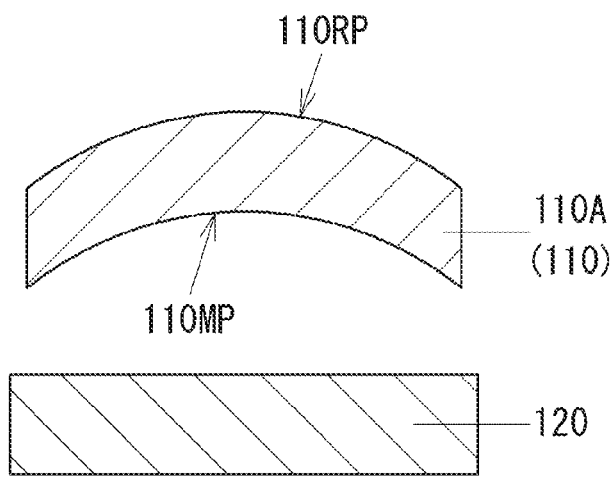
FIG. 13(A) is a view illustrating a state before the first substrate and the second substrate are joined to each other.
Figure 13B:
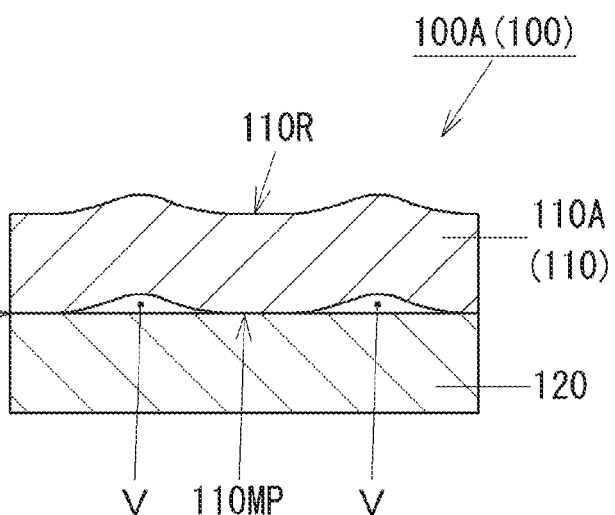
FIG. 13(B) is a view illustrating a state after the first substrate and the second substrate are joined to each other (composite substrate).
Figure 14A:
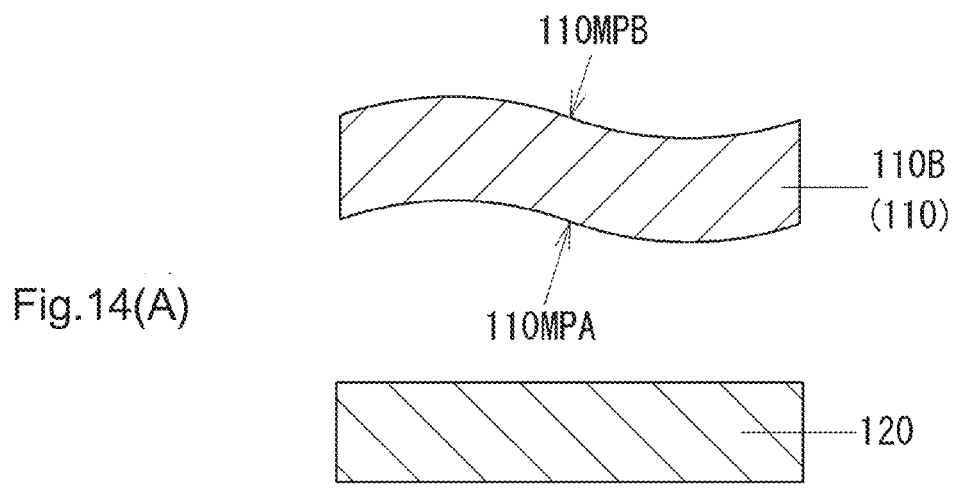
FIG. 14(A) is a view illustrating a state before the first substrate and the second substrate are joined to each other.
Figure 14B:
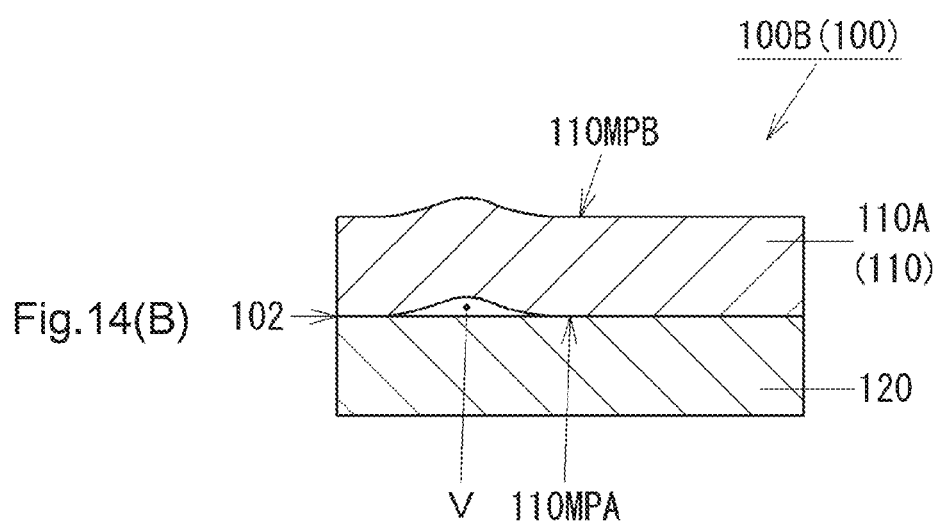
FIG. 14(B) is a view illustrating a state after the first substrate and the second substrate are joined to each other (composite substrate).

Note that, in the composite substrate manufacturing method illustrated in FIG. 13 and FIG. 14, by joining the first substrate 110 and the second substrate 120 under a depressurized environment, the possibility of appearance of the void V on the joined interface 102 can be reduced. In this case, it is necessary to carry out the joining in a vacuum chamber, and thus, productivity of the composite substrate 100 is reduced, and in addition, an apparatus used for the joining is more expensive and more complicated. However, in the composite substrate manufacturing method of this embodiment, even when the joining step is carried out under a normal pressure environment, air, or fluid members such as air and an adhesive, which exist between the mirror surface 10M as a protruding surface and the joining surface 20TP before the joining step starts can be easily efficiently pushed out from between the mirror surface 10M and the joining surface 20TP to the outside without entangling air within the joined interface 32. Therefore, even when the joining step is carried out under a normal pressure environment (atmospheric pressure), appearance of the void V can be prevented or inhibited quite easily.

Note that, the joining step may be carried out by, under a state in which any one of the first substrate 12 and the second substrate 22 is fixed, moving the other substrate, or, may be carried out by simultaneously moving both the substrates so as to be closer to each other. Further, in the joining step, the first substrate 12 that warps outward on the mirror surface 10M side is used, but the extent of the warpage may be spontaneously realized by imbalanced internal stress in a thickness direction of the first substrate 12, may be compulsorily realized by applying external force to the first raw board, or may be realized by combination of the two methods. Note that, the same can be said with regard to the second substrate 22. Note that, in the present application, the first substrate 12 before being deformed into a state in which the mirror surface 10M warps outward is referred to as a first raw board 10. Further, with regard to the second substrate 22B in a state in which the surface thereof to be joined to the first substrate 12 (joining surface 20TP) warps outward, the second substrate before being deformed into a state in which the mirror surface thereof warps outward is referred to as a second raw board.

Further, how the mirror surface 10M of the first substrate 12 and the joining surface 20TP of the second substrate 22 are joined on the joined interface 32 is not specifically limited, and, for example, joining using the Van der Waals force, joining by welding, joining using an adhesive, or the like can be appropriately selected. Further, a joining method such as joining by metallization using Au, plasma joining, or the like may be used. Note that, in the case of welding, heat processing is carried out before the joining step starts and/or during the joining step so that the temperature of the mirror surface 10M and/or the joining surface 20TP is set to be a temperature at which the welding can be carried out in the joining step. Further, in the case of joining using an adhesive, the adhesive is applied to the mirror surface 10M and/or joining surface 20TP before the joining step starts. It is preferred that, as the adhesive, an adhesive that exhibits low viscosity (for example, about 1.0 Pa·s to 3.0 Pa·s) under a room temperature environment (about 20° C. to 25° C.) be used, and, when the viscosity of the adhesive is high, the adhesive be used after the viscosity is lowered by heating in advance or the like.

Note that, an example of the first substrate 12 used in the joining step is, as described above, a substrate having one surface as the mirror surface 10M and the other surface as the rough surface 10R that has a surface roughness larger than that of the mirror surface 10M. In this case, the rough surface 10R has a substantial surface area per unit area taking the surface roughness into consideration which is larger than that of the mirror surface 10M, and thus, if only the difference in the substantial surface areas between the front and rear surfaces of the first substrate 12 is taken into consideration, the first substrate 12 intrinsically warps inward on the mirror surface 10M side. Therefore, according to the composite substrate manufacturing method of this embodiment, it is necessary to, by carrying out a first raw board deforming step for reversing the warpage before the joining step, prepare the first substrate 12 in a state in which the mirror surface 10M side warps outward.

Figure 4:
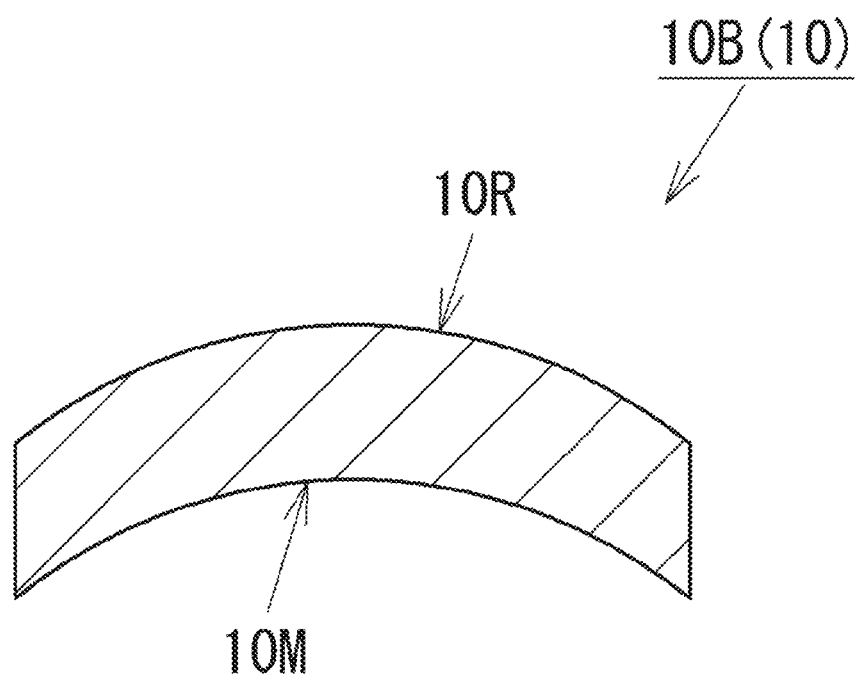
FIG. 4 is a schematic sectional view illustrating an exemplary first raw board before a first raw board deforming step is carried out in the composite substrate manufacturing method of this embodiment.

FIG. 4 is a schematic sectional view illustrating an exemplary first raw board before the first raw board deforming step is carried out in the composite substrate manufacturing method of this embodiment. A first raw board 10B (10) illustrated in FIG. 4 is the same as the first substrates 12A illustrated in FIG. 1 and FIG. 2 in that a surface thereof is the mirror surface 10M and the other surface thereof is the rough surface 10R, but is different in that the mirror surface 10M warps inward. A method of reversing a direction of the warpage of the first raw board 10B illustrated in FIG. 4 to obtain the first substrates 12A illustrated in FIG. 1 and FIG. 2 is not specifically limited, but, for example, the following methods (1) to (3) may be used.

(1) a method of compulsorily deforming the substrate by continuously applying external force to the first raw board 10B.

(2) a method of spontaneously deforming the substrate by processing for changing the balance of internal stress in a thickness direction of the first raw board 10B.

(3) a method of using both the methods (1) and (2) described above.

Here, when the method (1) described above is used, the first raw board deforming step can be, for example, carried out as follows. By bonding the rough surface 10R of the first raw board 10B to a convex surface of a fixing jig having the convex surface, or, by vacuum chucking the entire rough surface 10R with high sucking pressure, the first raw board 10B can be fixed with respect to the fixing jig. Further, by pushing a portion around a center portion of the rough surface 10R to the minor surface 10M side under a state in which an outer peripheral end of the first raw board 10B is fixed, the direction of the warpage can be reversed.

However, when the direction of the warpage is reversed by compulsorily applying the external force as described above, it is necessary to continuously apply the external force until the joining step is completed. Therefore, an existing production line of a composite substrate cannot be used as it is. In other words, in order to maintain the direction of the warpage of the first substrate 12 used in the joining step, it is necessary to newly provide a jig or an apparatus for continuously compulsorily applying the external force to the first raw board 10B (first substrate 12). Further, because the external force is compulsorily applied for the purpose of reversing the direction of the warpage, the first raw board 10B or the first substrate 12 may be broken or cracked. Therefore, when the thickness of the first raw board 10B or the first substrate 12 is small, the risk of breakage or crack is high. In addition to this, a substrate formed of a crystalline material such as a Si substrate is liable to brittle fracture when external force is applied thereto, and thus, it is not desired to continuously apply external force to the substrate for a long time until the joining step is completed. Further, when a substrate formed of a hard material such as sapphire is used, it is difficult to deform the substrate by external force. Further, when a fixing jig having a convex surface is used, it is also necessary to prepare fixing jigs having convex surfaces that are different in curvatures and shapes in accordance with the size, the thickness, the material, and the like of the first raw board 10B and the first substrate 12.

Figure 17:
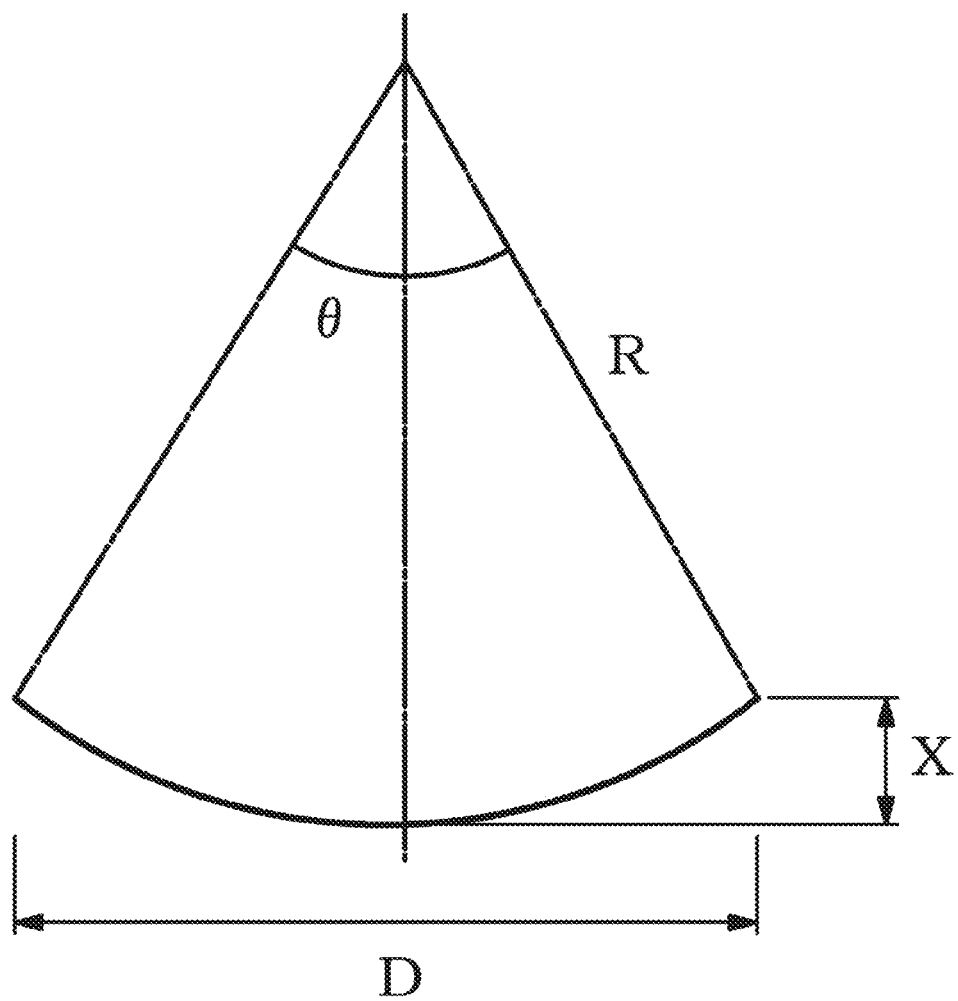
FIG. 17 is a schematic explanatory view illustrating a method of calculating, from a warpage amount of a circular substrate or raw board, a curvature of the substrate or raw board.

Taking those points into consideration, it is preferred to carry out the first raw board deforming step using the method (2) or the method (2) together with the method (1) described above as an auxiliary method. Note that, FIG. 17 is a schematic explanatory diagram illustrating a method of calculating, from a warpage amount of a circular substrate or raw board, a curvature of the substrate or raw board. A radius of curvature of the substrate or raw board is represented by R, the warpage amount of the substrate or raw board having a curvature 1/R is represented by X, and a diameter of the substrate or raw board is approximately represented by D in FIG. 17. By using the Pythagorean theorem, the relationship among those values can be expressed as $(1/R)^2 = ((1/R) - X)^2 + (D/2)^2$.

Figure 5A:
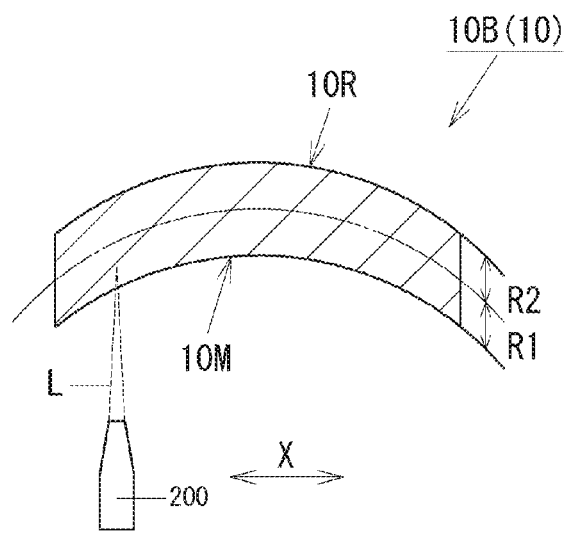
FIG. 5(A) is a view illustrating irradiation of a laser to the first raw board in a state in which a mirror surface thereof warps inward.

Here, in the method (2) described above, the first raw board deforming step is carried out as follows. First, as illustrated in FIG. 5(A), with regard to the first raw board 10B in a state in which the mirror surface 10M warps inward, a laser L is applied from a laser irradiation device 200 focusing on, of two regions R1 and R2 that are formed by dividing the first raw board 10B into two in the thickness direction, the inside of the region R1 on the mirror surface 10M side to be the joining surface side after the first raw board 10B becomes a first substrate 12B through the first raw board deforming step (the inside of the region to be joined to the second substrate 22). This forms a heat denatured layer 60 in the region R1 on the mirror surface 10M side. Therefore, the balance of internal stress in the thickness direction is changed in the first raw board 10B having the heat denatured layer 60 formed therein (that is, the first substrate 12B) and the mirror surface 10M warps outward. Note that, in the example illustrated in FIG. 5(B), four heat denatured layers 60A (60), 60B (60), 60C (60), and 60D (60) are formed in the region R1.

In this case, the heat denatured layer 60 acts to warp outward the region R1 having the heat denatured layer 60 formed therein. The heat denatured layer 60 is formed by, through multiphoton absorption of atoms existing in a region to which a laser is applied, locally heating the region to denature a surrounding region thereof with regard to the crystal structure, the crystallinity, or the like. Here, the extent of the curvature of the first substrate 12B in which the direction of the warpage is reversed by the laser irradiation can be easily controlled as desired by appropriately selecting laser irradiation conditions, a place in the region R1 at which the heat denatured layer 60 is formed, and the like, taking into consideration the material, the thickness, the size, and the like of the first substrate 12B. Note that, details of the laser irradiation processing illustrated in FIG. 5 are described later.

Figure 5B:
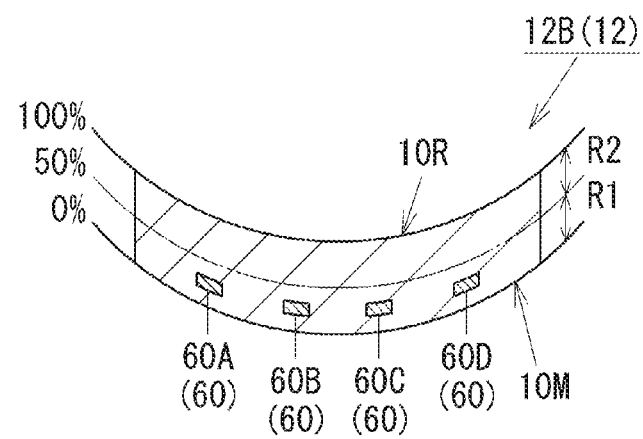
FIG. 5(B) is a view illustrating the first substrate after the laser irradiation processing is completed.
Figure 6:
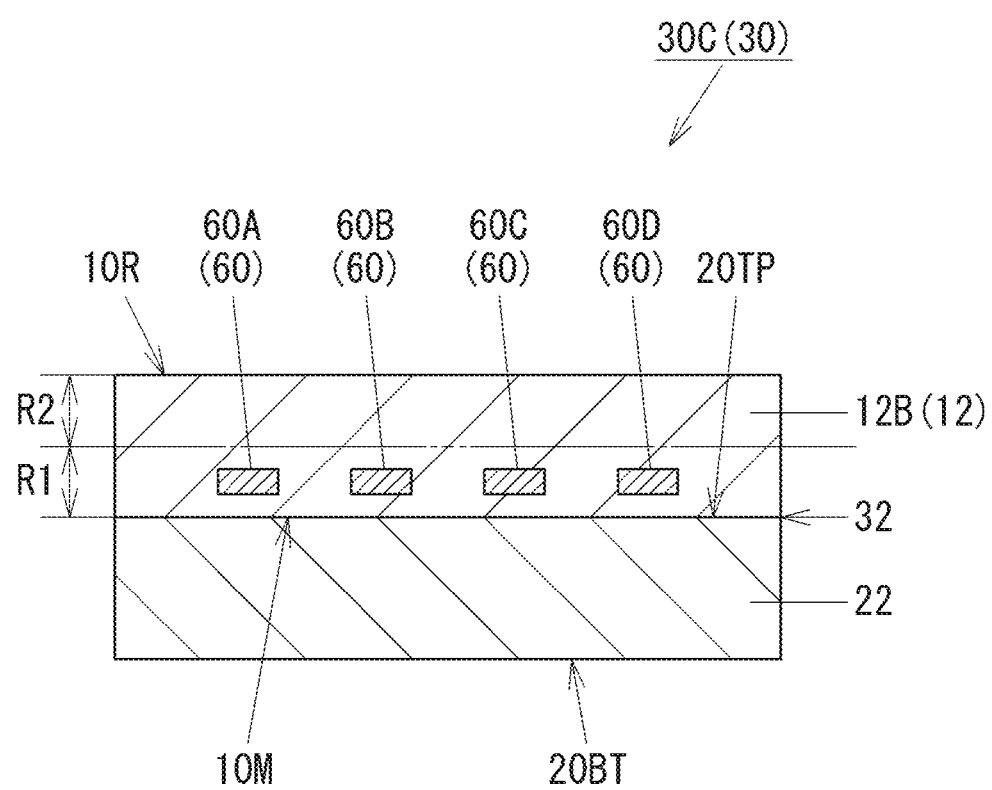
FIG. 6 is a schematic sectional view illustrating another exemplary composite substrate of this embodiment manufactured using the first substrate illustrated in FIG. 5(B).

In the embodiment illustrated in FIG. 1 or FIG. 2, when the first substrate 12B illustrated in FIG. 5(B) is used as the first substrate 12A in a state in which the mirror surface 10M warps outward, a composite substrate 30C (30) illustrated in FIG. 6 can be obtained. Here, the composite substrate 30C illustrated in FIG. 6 includes the first substrate 12B and the second substrate 22, and has a structure in which one surface (mirror surface 10M) of the first substrate 12B and one surface (joining surface 20TP) of the second substrate 22 are joined to each other. Here, in the composite substrate 30C illustrated in FIG. 6, after the first raw board 10B of the two regions formed by dividing the first substrate 12B into two in the thickness direction becomes the first substrate 12B through the first raw board deforming step, the heat denatured layer 60 is formed in the region R1 on the mirror surface 10M side that is the joined surface side (in the region on the side that is joined to the second substrate 22).

Note that, in the specification of the present application, the mirror surface 10M of the first raw board 10B (first substrate 12) having one surface as a mirror surface means a relatively smooth surface compared with the rough surface 10R. The minor surface 10M has a surface roughness as an arithmetic mean roughness Ra in a range of from 0.05 nm to 100.0 nm, and it is more preferred that the arithmetic mean roughness Ra be in a range of from 0.05 nm to 10.0 nm The mirror surface 10M may be a surface formed through any manufacturing process. For example, the minor surface 10M may be a surface that is formed simultaneously when the first raw board 10B is formed directly from a melt into the shape of a substrate, or, may be a surface that is formed simultaneously when the first raw board 10B is formed into the shape of a substrate (in the shape of a thick film) by forming a film on a surface of a support. However, in general, it is particularly preferred that the mirror surface 10M be a surface formed through a mirror polishing step of minor polishing so that the arithmetic mean roughness Ra is in the range described above.

Further, the rough surface 10R means a surface having a relatively large roughness compared with that of the mirror surface 10M. Here, it is only necessary that a ratio of the arithmetic mean roughness Ra of the rough surface 10R (Ra(10R)) to the arithmetic mean roughness Ra of the mirror surface 10M (Ra(10M)), that is, Ra(10R)/Ra(10M) be at least larger than 1. However, from the viewpoint that, when the warpage of the first raw board 10B before the first raw board deforming step is carried out is large, the advantage of using the composite substrate manufacturing method of this embodiment to manufacture a composite substrate is high, in general, Ra(10R)/Ra(10M) is preferably 4 or more, and more preferably 40 or more. Note that, an upper limit to Ra(10R)/Ra(10M) is not specifically limited, but, from a practical viewpoint, it is preferred that Ra(10R)/Ra(10M) be 24,000 or less. Further, the arithmetic mean roughness Ra of the rough surface 10R is not specifically limited insofar as Ra(10R)/Ra(10M) is in a range of at least larger than 1. However, generally, it is preferred that the arithmetic mean roughness Ra of the rough surface 10R be in a range of about 400 nm to 1,200 nm.

The rough surface 10R may be a surface formed through any manufacturing process. For example, the rough surface 10R may be a surface that is formed simultaneously when the first raw board 10B is formed directly from a melt into the shape of a substrate, or, may be a surface that is formed simultaneously when the first raw board 10B is formed into the shape of a substrate (in the shape of a thick film) by forming a film on a surface of a support. However, in general, it is particularly preferred that the rough surface 10R be a surface formed through lapping abrasion, grinding, or slicing a columnar ingot so that Ra(10R)/Ra(10M) is in the range described above.

Here, the arithmetic mean roughnesses Ra of the minor surface 10M and the rough surface 10R mean values determined using an atomic force microscope under measurement conditions described below.

Measurement Device: scanning probe microscope SPI3800N/SPA500 (manufactured by Seiko Instruments Inc.)

Measurement Mode: Dynamic Force Mode (DFM)

Cantilever: SI-DF40 (formed of silicon, spring constant of 42 N/m, resonance frequency of 250 kHz to 390 kHz, probe tip R≤10 nm)

Measured Area: 10 μm×10 μm

Number of Measured Points: 512×512 points

Note that, as the first raw board 10B and the first substrate 12A, a substrate having one surface as the minor surface 10M and the other surface as the rough surface 10R has been described as an example, but each of the other surfaces of the first raw board 10 and the first substrate 12 may be a mirror surface, not the rough surface 10R. In other words, both the surfaces of the first raw board 10 and the first substrate 12 may be minor surfaces. The first raw board 10 used in the first raw board deforming step is not specifically limited insofar as at least one surface thereof is a mirror surface. However, in general, a raw board having both surfaces as substantially flat and mirror surfaces, a raw board that has one surface as a mirror surface and the other surface as a rough surface and warps inward on the mirror surface side, or a raw board having one surface as a mirror surface and the other surface as a rough surface, both of which are substantially flat surfaces, is used. Here, as the first raw board 10 having both surfaces as substantially flat and mirror surfaces, for example, a substrate manufactured through a step of mirror polishing the respective surfaces can be used. FIG. 7(A) is a schematic sectional view illustrating a first raw board 10C (10) having both surfaces as the mirror surfaces 10M. Here, when the first raw board 10C is manufactured by mirror polishing both the surfaces, as illustrated in FIG. 7(A), minute undulations are caused due to nonuniform polishing. Therefore, there is a possibility that, due to such minute undulations, the void V as described above appears on the joined interface 32 with the second substrate 22.

Therefore, as illustrated in FIG. 7(A), the laser L may be applied from the laser irradiation device 200 focusing on, of the two regions R1 and R2 that are formed by dividing the first raw board 10C with minute undulations caused therein into two in the thickness direction, the inside of the region R1 on the mirror surface side to be the joining surface side after the first raw board 10C becomes a first substrate 12C (12) through the first raw board deforming step (the inside of the region to be joined to the second substrate 22) to form the heat denatured layer 60 in the region R1. Through forming the heat denatured layer 60 in the region R1, the first raw board 10C may be deformed as illustrated in FIG. 7(B) to form the first substrate 12C that warps outward on the region R1 side.

Figure 8A:
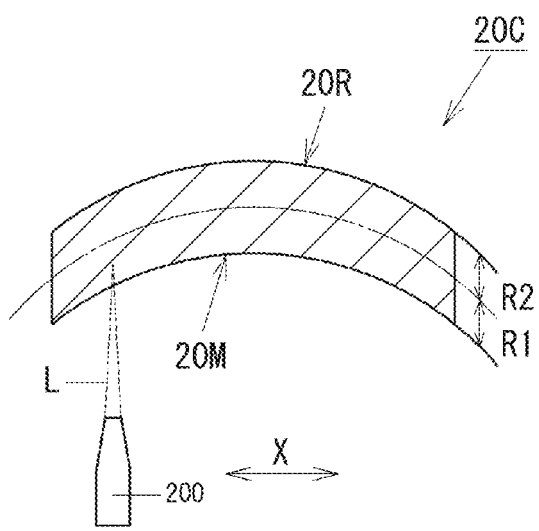
FIG. 8(A) is a view illustrating irradiation of a laser to a second raw board in a state in which a mirror surface thereof warps inward.
Figure 8B:
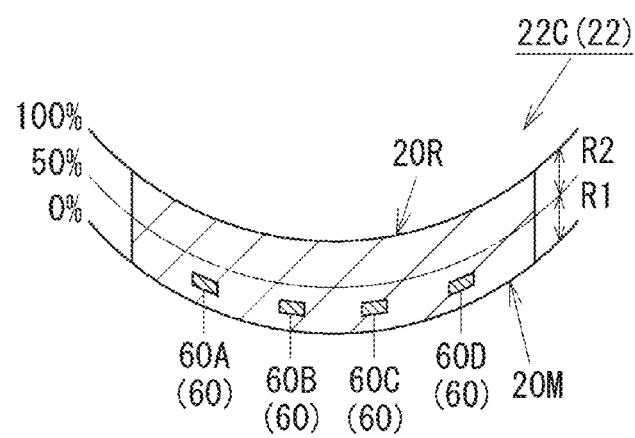
FIG. 8(B) is a view illustrating a second substrate after the laser irradiation processing is completed.
Figure 9:
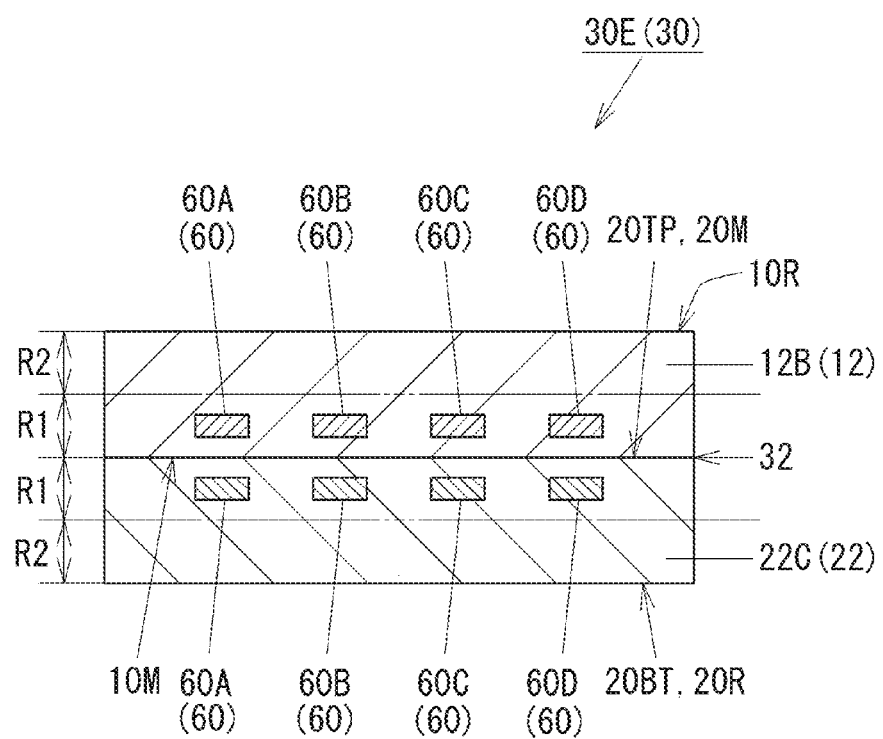
FIG. 9 is a schematic sectional view illustrating another exemplary composite substrate of this embodiment manufactured using the second substrate illustrated in FIG. 8(B).

Further, as the second substrate 22B illustrated in FIG. 2(A), a substrate that warps outward on the joining surface 20TP side from the beginning may be used as it is, but a substrate that warps inward on the joining surface 20TP side or a deformed substrate having both substantially flat surfaces with minute undulations may also be used. In other words, the second substrate in a state in which a surface thereof to be joined to the first substrate 12A warps outside may be manufactured through the second raw board deforming step of deforming the second raw board having at least one surface as a mirror surface so that the mirror surface warps outward. In this case, the second raw board deforming step can be, for example, carried out as illustrated in FIG. 8(A). Specifically, with regard to a second raw board 20C in a state in which a minor surface 20M (forming one surface thereof) warps inward and the other surface is a rough surface 20R, through irradiation of the laser L from the laser irradiation device 200 focusing on, of the two regions R1 and R2 that are formed by dividing the second raw board 20C into two in the thickness direction, the inside of the region R1 on the mirror surface 20M side to be the joining surface side after the second raw board 20C becomes a second substrate 22C (22) through the second raw board deforming step (the inside of the region to be joined to the first substrate 12), the second raw board deforming step is carried out. This forms, as illustrated in FIG. 8(B), the heat denatured layers 60A (60), 60B (60), 60C (60), and 60D (60) in the region R1 on the mirror surface 20M side, and the second substrate 22C that warps outward on the region R1 side is formed. The second substrate 22C may be used instead of the second substrate 22B illustrated in FIG. 2(A) to be joined to the first substrate 12. In this case, when the first substrate 12B illustrated in FIG. 5(B) is used instead of the first substrate 12A illustrated in FIG. 2(A), a composite substrate 30E (30) as illustrated in FIG. 9 is obtained. The composite substrate 30E includes the first substrate 12B and the second substrate 22C. In this case, the heat denatured layer 60 is formed in, of the two regions R1 and R2 formed by dividing the first substrate 12B into two in the thickness direction, the inside of the region R1 on the mirror surface 10M side that is the joined surface side, and in, of the two regions R1 and R2 formed by dividing the second substrate 22C into two in the thickness direction, the inside of the region R1 on the minor surface 20M side that is the joined surface side.

Note that, in the specification of the present application, the mirror surface 20M of each of the second raw board 20C and the second substrate 22C having one surface as a mirror surface means a relatively smooth surface compared with the rough surface 20R. The mirror surface 20M has a surface roughness as an arithmetic mean roughness Ra in a range of from 0.05 nm to 100.0 nm, and it is more preferred that the arithmetic mean roughness Ra be in a range of from 0.05 nm to 10.0 nm The minor surface 20M may be a surface formed through any manufacturing process. For example, the mirror surface 20M may be a surface that is formed simultaneously when the second raw board 20C is formed directly from a melt into the shape of a substrate, or, may be a surface that is formed simultaneously when the second raw board 20C is formed into the shape of a substrate (in the shape of a thick film) by forming a film on a surface of a support. However, in general, it is particularly preferred that the mirror surface 20M be a surface formed through a minor polishing step of mirror polishing so that the arithmetic mean roughness Ra is in the range described above.

Further, the rough surface 20R means a surface having a relatively large roughness compared with that of the mirror surface 20M. Here, it is only necessary that a ratio of the arithmetic mean roughness Ra of the rough surface 20R (Ra(20R)) to the arithmetic mean roughness Ra of the mirror surface 20M (Ra(20M)), that is, Ra(20R)/Ra(20M) be at least larger than 1. However, from the viewpoint that, when the warpage of the second raw board 20C before the second raw board deforming step is carried out is large, the advantage of using the composite substrate manufacturing method of this embodiment to manufacture a composite substrate is high, in general, Ra(20R)/Ra(20M) is preferably 4 or more, and more preferably 40 or more. Note that, an upper limit to Ra(20R)/Ra(20M) is not specifically limited, but, from a practical viewpoint, it is preferred that Ra(20R)/Ra(20M) be 24,000 or less. Further, the arithmetic mean roughness Ra of the rough surface 10R is not specifically limited insofar as Ra(20R)/Ra(20M) is in a range of at least larger than 1. However, generally, it is preferred that the arithmetic mean roughness Ra of the rough surface 20R be in a range of about 400 nm to 1,200 nm.

The rough surface 20R may be a surface formed through any manufacturing process. For example, the rough surface 20R may be a surface that is formed simultaneously when the second raw board 20C is formed directly from a melt into the shape of a substrate, or, may be a surface that is formed simultaneously when the second raw board 20C is formed into the shape of a substrate (in the shape of a thick film) by forming a film on a surface of a support. However, in general, it is particularly preferred that the rough surface 20R be a surface formed through lapping abrasion, grinding, or slicing a columnar ingot so that Ra(20R)/Ra(20M) is in the range described above.

Here, the arithmetic mean roughnesses Ra of the minor surface 20M and the rough surface 20R mean values determined using an atomic force microscope under measurement conditions described below.
Measurement Device: scanning probe microscope SPI3800N/SPA500 (manufactured by Seiko Instruments Inc.)
Measurement Mode: Dynamic Force Mode (DFM)
Cantilever: SI-DF40 (formed of silicon, spring constant of 42 N/m, resonance frequency of 250 kHz to 390 kHz, probe tip R≤10 nm)
Measured Area: 10 μm×10 μm
Number of Measured Points: 512×512 points As the second raw board 20C and the second substrate 22C, a substrate having one surface as the minor surface 20M and the other surface as the rough surface 20R has been described as an example, but each of the other surfaces of the second raw board 20 and the second substrate 22 may be a mirror surface, not the rough surface 20R. In other words, both the surfaces of the second raw board and the second substrate 22 may be minor surfaces. In this case, it is desired that both the surfaces of the second raw board and the second substrate 22 be minor surfaces formed by being uniformly minor polished. Note that, when undulations are caused due to non-uniform polishing when both the surfaces are mirror polished (such undulations that cause, after the joining to the first substrate 12, the void V on the joined interface 32) in both the surfaces, similarly to the case of the first raw board 10C illustrated in FIG. 7(A), the laser L may be applied from the laser irradiation device 200 focusing on, of the two regions R1 and R2 that are formed by dividing the second raw board into two in the thickness direction, the inside of the region R1 on the mirror surface side to be the joining surface side after the second raw board becomes the second substrate through the second raw board deforming step (the inside of the region to be joined to the first substrate 12) to form the heat denatured layer 60 in the region R1. By forming the heat denatured layer 60 in the region R1, the second raw board is also deformed as illustrated in FIG. 7(B). In this way, the second substrate that warps outward on the region R1 side can be obtained.

The second raw board deforming step of the second substrate may be carried out by a method of compulsorily deforming the substrate by continuously applying external force to the second raw board, or, by the irradiation method of the laser L described above together with such a method of continuously applying external force as an auxiliary method. However, from the viewpoints of using an existing production line of a composite substrate and of preventing breakage, a crack, and brittle fracture of the second raw board, the irradiation method of the laser L is more preferred.

Note that, the first raw board 10B and the second raw board 20C in a state in which the minor surfaces 10M and 20M warp inward before the first raw board deforming step and the second raw board deforming step as illustrated in FIG. 4 and FIG. 8 are carried out have curvatures of at least 7.3 km$^{-1}$ or more. However, when the composite substrate 30 is manufactured using the composite substrate manufacturing method of this embodiment, from the viewpoint of sufficiently enjoying the advantage in that a void that intrinsically appears on the joined interface 32 can be inhibited more effectively, the curvatures are preferably 15 km$^{-1}$ or more, and more preferably 20 km$^{-1}$ or more. Further, an upper limit value of the curvatures is not specifically limited, but it is preferred that the curvatures be 30 km$^{-1}$ or less. This facilitates reduction of harmful effects of too large curvatures, that is, the possibility of breakage and a crack of the first raw board 10B and the second raw board 20C in the process of manufacturing the composite substrate. The curvatures of the first raw board 10B and the second raw board 20C can be adjusted to a desired value by appropriately selecting Ra(10R)/Ra(10M) or Ra(20R)/Ra(20M), taking into consideration thicknesses, lengthwise and breadthwise sizes, and materials of the first raw board 10B and the second raw board 20C. Note that, when a raw board having both substantially flat surfaces is used as the first raw board or the second raw board, it is particularly preferred that the curvature of the first raw board or the second raw board be substantially 0 km$^{-1}$. However, existence of warpage and undulations to some extent is allowed, and the curvature may be in a range of 0 km$^{-1}$ or more and less than 7.3 km$^{-1}$ with which the surfaces can be regarded as substantially flat. In this case, when one surface is a mirror surface, the other surface may be a mirror surface or a rough surface.

Note that, a warpage amount of the first raw board 10B or the second raw board 20C before the first raw board deforming step or the second raw board deforming step is carried out is a difference between a height of the lowest place and a height of the highest place of the mirror surface 10M or 20M of the raw board 10B or 20C in the thickness direction. In the case of FIG. 4 or FIG. 8(A), the lowest places of the mirror surfaces 10M and 20M are peripheral portions of the raw boards 10B and 20C and the highest places are center portions of the raw boards 10B and 20C, respectively.

In addition, the first substrate 12 in a state in which the mirror surface 10M warps outward after the first raw board deforming step is carried out as illustrated in FIG. 1(A), FIG. 2(A), FIG. 3(A), FIG. 5(B), or FIG. 7(B) and before the joining step is carried out, and the second substrate 22C in a state in which the mirror surface 20M warps outward after the second raw board deforming step is carried out as illustrated in FIG. 8(B) and before the joining step is carried out have curvatures of at least 7.3 km$^{-1}$ or more. However, when the composite substrate 30 is manufactured using the composite substrate manufacturing method of this embodiment, from the viewpoint of sufficiently enjoying the advantage in that a void that intrinsically appears on the joined interface 32 can be inhibited more effectively, the curvatures are preferably 9 km$^{-1}$ or more, and more preferably 15 km$^{-1}$ or more. Further, an upper limit value of the curvatures of the first substrate 12 or the second substrate 22C after the first raw board deforming step or the second raw board deforming step is carried out and before the joining step is carried out is not specifically limited, but is preferably 50 km$^{-1}$ or less. This facilitates reduction of harmful effects of too large curvatures, that is, the possibility of breakage and a crack of the first substrate 12 and the second substrate 22C in the process of the joining step.

Note that, it is preferred that a curvature of the second substrate 22B in a state in which the surface to be joined to the first substrate 12A (joining surface 20TP) warps outward as illustrated in FIG. 2(A) without carrying out the second raw board deforming step be set similarly to the curvature of the second substrate 22C. The curvature of the first substrate 12 or the second substrate 22C after the first raw board deforming step or the second raw board deforming step is carried out and before the joining step is carried out can be adjusted to a desired value by appropriately selecting conditions for carrying out the first raw board deforming step or the second raw board deforming step, taking into consideration the thickness, the lengthwise and breadthwise sizes, the material, and the curvature of the first raw board 10B or the second raw board 20C before the first raw board deforming step or the second raw board deforming step is carried out. For example, when the first raw board deforming step or the second raw board deforming step is carried out by the laser irradiation processing as illustrated in FIG. 5 or FIG. 8, by appropriately selecting a wavelength, a strength, a spot size, and an irradiation time period of the laser light, an irradiation place, an irradiation range, and an irradiation pattern of the laser with respect to a plane direction and the thickness direction of the first raw board 10B or the second raw board 20C, and the like, the curvature can be adjusted to a desired value.

Note that, a warpage amount of the first substrate 12 or the second substrate 22C after the first raw board deforming step or the second raw board deforming step is carried out is a difference between a height of the lowest place and a height of the highest place of the mirror surface 10M or 20M of the substrate 12 or 22C in the thickness direction. In the case of FIG. 1(A), FIG. 2(A), FIG. 5(B), or FIG. 8(B), the lowest places of the mirror surfaces 10M and 20M are center portions of the substrates 12 and 22C and the highest places are peripheral portions of the substrates 12 and 22C, respectively. In this regard, in the case of FIG. 3, the lowest places of the mirror surfaces 10M and 20M are left peripheral portions of the substrate 12A (places held in contact with the second substrate 22A) and the highest places are right peripheral portions of the substrate 12A.

When the second substrate 22A as illustrated in FIG. 1(A) having both surfaces (joining surface 20TP and non-joining surface 20BT) as substantially flat surfaces is used as the second substrate 22, which does not undergo the second raw board deforming step described above, among the second substrates 22 used in the joining step, it is particularly preferred that the curvature of the second substrate 22A be substantially 0 km$^{-1}$. However, existence of warpage and undulations to some extent is allowed in the second substrate 22A. The second substrate 22A which does not undergo the second raw board deforming step described above may slightly warp so that the mirror surface thereof warps inward, and may have the curvature in a range of 0 km$^{-1}$ or more and less than 7.3 km$^{-1}$ with which the surface can be regarded as substantially flat.

Note that, in the composite substrate manufacturing method of this embodiment, it is preferred that the curvature of the first substrate 12 used in the joining step be appropriately adjusted in the first raw board deforming step in accordance with whether the second substrate 22 used in the joining step warps or not and with the extent of the curvature thereof. When the second substrate 22 is the second substrate 22B as illustrated in FIG. 2(A) in which the joining surface 20TP warps outward, if the curvature of the first substrate 12 used in the joining step is also large, it is sometimes difficult to join together the mirror surface 10M and the joining surface 20TP both of which are convex surfaces, without a void over the entire surfaces. In addition to this, even if the mirror surface 10M and the joining surface 20TP can be joined to each other without a void over the entire surfaces, there are cases in which the first substrate 12 and/or the second substrate 22 included in the composite substrate 30 may be more liable to be cracked or broken. Therefore, in such a case, it is preferred that the curvature of the first substrate 12 used in the joining step be set to be smaller.

Next, details of the laser irradiation processing when the first raw board deforming step or the second raw board deforming step illustrated in FIG. 5, FIG. 7, and FIG. 8 is carried out are described. First, the laser may be applied under any irradiation conditions insofar as the heat denatured layer 60 can be formed. However, generally, it is preferred to apply the laser in the following ranges (1) and (2) using a pulsed laser that intermittently emits laser light because energy can be concentrated within a short time period to obtain a high peak output.

(1) Laser Wavelength: 200 nm to 5,000 nm
(2) Pulse Width: the order of femtoseconds to the order of nanoseconds (1 fs to 1,000 ns)

Here, the laser wavelength and the pulse width are appropriately selected taking into consideration light permeability/light absorbance stemming from a material of the first raw board 10 or the second raw board 20C to which the laser is applied, size and pattern accuracy of the heat denatured layer 60 formed in the first raw board 10B, the first raw board 10C, or the second raw board 20C, a practically usable laser, and the like. However, with regard to the laser irradiation, it is particularly preferred to select any one of the following irradiation conditions A, irradiation conditions B, and irradiation conditions C.

<Irradiation Conditions A>
  Laser Wavelength: 200 nm to 400 nm
  Pulse Width: the order of nanoseconds (1 ns to 1,000 ns), and more preferably 10 ns to 15 ns
<Irradiation Conditions B>
  Laser Wavelength: 350 nm to 2,000 nm
  Pulse Width: the order of femtoseconds to the order of picoseconds (1 fs to 1,000 ps), and more preferably 200 fs to 800 fs
<Irradiation Conditions C>
  Laser Wavelength: 1,000 nm to 1,600 nm
  Pulse Width: the order of nanoseconds, and more preferably 50 ns to 500 ns Here, when at least one raw board (substrate) selected from the first raw board 10 and the second raw board 20C is a sapphire substrate, the irradiation conditions A and B described above can be used. In this case, it is preferred that conditions other than the laser wavelength and the pulse width be selected within the following ranges from the viewpoint of, for example, practicality, mass-producibility, and the like.

Repetition Frequency: 50 kHz to 500 kHz
  Laser Power: 0.05 W to 0.8 W
  Laser Spot Size: 0.5 µm to 4.0 µm (more preferably in the neighborhood of 2 µm)
  Sample Stage Scan Speed: 100 mm/s to 1,000 mm/s Further, when the first raw board 10 and the second raw board 20C are Si substrates, the irradiation conditions C described above can be used. In this case, it is preferred that conditions other than the laser wavelength be selected within the following ranges from the viewpoint of, for example, practicality, mass-producibility, and the like.

Pulse Width: 50 ns to 500 ns
Repetition Frequency: 10 kHz to 500 kHz
Applied Energy: 3 μJ to 12 μJ
Laser Spot Size: 0.5 μm to 4.0 μm
Sample Stage Scan Speed: 50 mm/s to 1,000 mm/s (more preferably 100 mm/s to 1,000 mm/s)

Further, when the first raw board 10 and the second raw board 20C are GaAs substrates, the irradiation conditions C described above can be used. In this case, it is preferred that conditions other than the laser wavelength be selected within the following ranges from the viewpoint of, for example, practicality, mass-producibility, and the like.

Pulse Width: 30 ns to 80 ns
Repetition Frequency: 10 kHz to 500 kHz
Applied Energy: 8 μJ to 20 μJ
Laser Spot Size: 0.5 μm to 4.0 μm
Sample Stage Scan Speed: 50 mm/s to 1,000 mm/s (more preferably 100 mm/s to 1,000 mm/s)

Further, when the first raw board 10 and the second raw board 20C are quartz substrates, the irradiation conditions B described above can be used. In this case, it is preferred that conditions other than the laser wavelength be selected within the following ranges from the viewpoint of, for example, practicality, mass-producibility, and the like.

Pulse Width: 200 fs to 800 fs
Repetition Frequency: 10 kHz to 500 kHz
Applied Energy: 3 μJ to 6 μJ
Laser Spot Size: 0.5 μm to 4.0 μm
Sample Stage Scan Speed: 50 mm/s to 1,000 mm/s (more preferably 100 mm/s to 1,000 mm/s)

Note that, Table 1 shows exemplary laser irradiation conditions when the heat denatured layer 60 is formed in a Si substrate, a GaAs substrate, and a quartz substrate. Further, in the case of the laser irradiation, surfaces to which the laser is applied of the first raw board 10 and the second raw board 20C may be any one of the mirror surfaces 10M and 20M and the rough surfaces 10R and 20R, but in general, the minor surfaces 10M and 20M are preferred as illustrated in FIG. 5(A), FIG. 7(A), and FIG. 8(A). Note that, from the viewpoint of inhibiting light scattering when the laser is applied, it is preferred that the arithmetic mean roughnesses Ra of the mirror surfaces 10M and 20M be about 1 nm or less.

TABLE 1

|  | Si | GaAs | Quartz |
|---|---|---|---|
| Wavelength | 1,342 nm | 1,064 nm | 1,045 nm |
| Pulse Width | 90 ns | 70 ns | 500 fs |
| Repetition Frequency | 80 kHz | 15 kHz | 100 kHz |
| Spot Size | 1.5 μm | 1.5 μm | 1.0 μm |
| Laser Power | 0.3 W to 1.4 W | 0.2 W | 0.4 W |
| Stage Scan Speed | 300 mm/s to 400 mm/s | 200 mm/s | 400 mm/s |

Here, in the examples illustrated in FIG. 5(A), FIG. 7(A), and FIG. 8(A), laser irradiation to the first raw board 10 or the second raw board 20C is, in general, carried out under a state in which the first raw board 10 or the second raw board 20C is fixed to a sample stage (not shown). Note that, it is preferred that the fixing be carried out by, for example, vacuum suction. In this case, it is particularly preferred that, with regard to the first raw board 10B, substantially the entire rough surface 10R be vacuum sucked, with regard to the second raw board 20C, substantially the entire rough surface 20R be vacuum sucked, and, with regard to the first raw board 10C, substantially the entire surface of any one of the mirror surfaces 10M be vacuum sucked, and that warpage of the first raw board 10 or the second raw board 20C be corrected to compulsorily flatten the minor surface 10M or 20M that warps inward or the minor surface 10M that has minute undulations. Note that, at the time of irradiation of the laser L to be described later, warpage of the first raw board 10B or the second raw board 20C or undulations in the first raw board 10C are desirably compulsorily flattened, and, even if complete flattening cannot be carried out, a position at which the laser L is collected can be stabilized by using the function of following a surface height of the first raw board 10 or the second raw board 20C to be processed. Note that, when the second raw board does not warp unlike the second raw board 20C illustrated in FIG. 8(A), but undulates due to double side polishing, the second substrate may be manufactured by laser processing similarly to the case of the first raw board 10C illustrated in FIG. 7. In this way, the second substrate that warps outward on the joining surface 20TP side can be obtained.

Then, the laser L is applied by the laser irradiation device 200 from a side of the raw board fixed to the sample stage (first raw board 10 or second raw board 20C) opposite to the side on which the sample stage is arranged (from minor surface 10M or 20M). At this time, by collecting the laser L in the region R1 and relatively moving the laser irradiation device 200 and the raw board (first raw board 10 or the second raw board 20C) in a horizontal direction (to the right and to the left shown by a double-headed arrow X in FIG. 5(A), FIG. 7(A), and FIG. 8(A)), the heat denatured layer 60 is formed. Here, by appropriately selecting the spot size, the laser power, the pulse width, and the like of the laser L, the size of the heat denatured layer 60 with respect to the plane direction and the thickness direction of the raw board (first raw board 10 or second raw board 20C) and the extent of denaturation thereof can be controlled. Further, by appropriately selecting relative moving speed of the laser irradiation device 200 with respect to the raw board (first raw board 10 or second raw board 20C) (for example, when the sample stage is movable, the sample stage scan speed) and the repetition frequency of the laser, a spacing between the heat denatured layers 60A, 60B, 60C, and 60D with respect to the plane direction of the first substrate 12B or 12C or the second substrate 22C can be controlled.

Further, with regard to the first substrate 12B or 12C or the second substrate 22C to be used in the joining step, the heat denatured layer 60 may be formed in the region R2 as necessary, in addition to the region R1. However, also in this case, the heat denatured layer 60 is formed in the region R2 insofar as a state in which the mirror surface 10M or 20M warps outward can be maintained. For example, in the case where the heat denatured layer 60 is formed in the region R1, if the curvature of the first substrate 12B or 12C or the second substrate 22C becomes larger than necessary, the heat denatured layer 60 can be formed in the region R2 for the purpose of adjusting the curvature.

Note that, the first substrate 12B or 12C or the second substrate 22C after the laser processing warps so that the mirror surface 10M or 20M warps outward, and it is preferred that the protruding surface be a surface that curves so as to be substantially symmetrical with respect to a center point of the mirror surface 10M or 20M. When the symmetry of the protruding surface (mirror surface 10M or 20M) is weak, and/or, when the protruding surface (mirror surface 10M or 20M) undulates, the void V is more liable to appear on the joined interface 32.

In order to inhibit/avoid such a problem, it is preferred that the heat denatured layer 60 be formed in parallel to the mirror surface 10M or 20M, which is the protruding surface of the first substrate 12B or 12C or the second substrate 22C. Further, in this case, as illustrated in FIG. 5(B) and FIG. 7(B), when it is assumed that the relative place in the first substrate 12B or 12C in the thickness direction is 0% at one surface to be joined to the second substrate 22 (the mirror surface 10M with regard to the first substrate 12B, and one mirror surface 10M with regard to the first substrate 12C) and 100% at the other surface (the rough surface 10R with regard to the first substrate 12B, and the other mirror surface 10M with regard to the first substrate 12C), it is preferred that the heat denatured layer 60 be formed in a range of 5% or more and less than 50% in the thickness direction of the first substrate 12B or 12C, and it is more preferred that the heat denatured layer 60 be formed in a range of 5% or more and 30% or less. Similarly, as illustrated in FIG. 8(B), when it is assumed that the relative place in the second substrate 22C in the thickness direction is 0% at one surface to be joined to the first substrate 12 (mirror surface 20M) and 100% at the other surface (rough surface 20R), it is preferred that the heat denatured layer 60 be formed in a range of 5% or more and less than 50% in the thickness direction of the second substrate 22C, and it is more preferred that the heat denatured layer 60 be formed in a range of 5% or more and 30% or less.

By forming the heat denatured layer 60 in a range of 5% or more in the thickness direction of the first substrate 12B or 12C or the second substrate 22C, the heat denatured layer 60 can be formed in a manner that the heat denatured layer 60 is prevented from piercing the surface of the substrate and an adverse effect of the piercing on the surface roughness of the surface of the substrate is prevented. Further, by forming the heat denatured layer 60 in a range of less than 50% in the thickness direction of the first substrate 12B or 12C or the second substrate 22C, the first substrate 12B or 12C or the second substrate 22C can be warped so that the mirror surface 10M or 20M warps outward.

Further, in order to inhibit/avoid lowering of the symmetry and/or appearance of undulations of the protruding surface (mirror surface 10M or 20M) described above, it is preferred that the heat denatured layer 60 be formed in the following pattern shape. Specifically, it is preferred that the heat denatured layer 60 be formed in at least any one pattern shape selected from the following i) to viii) with respect to the plane direction of the first substrate 12B or 12C or the second substrate 22C.

i) a shape in which a plurality of polygons of the same shape and the same size are regularly arranged
ii) a shape in which a plurality of circles or ellipses of the same shape and the same size are regularly arranged
iii) a concentrically circular shape
iv) a shape formed so as to be substantially symmetrical with respect to the center point of the first substrate 12B or 12C or the second substrate 22C
v) a shape formed so as to be substantially symmetrical with respect to a line passing through the center point of the first substrate 12B or 12C or the second substrate 22C
vi) a striped shape
vii) a spiral shape
viii) a lattice shape Note that, from the viewpoint of more effectively inhibiting/avoiding lowering of the symmetry and/or appearance of undulations of the protruding surface (minor surface 10M or 20M), the pattern shapes shown in i) to iv) and viii) of the above-mentioned eight pattern shapes are more preferred.

Further, when the heat denatured layer 60 is to be formed, from the viewpoint that laser scanning, that is, relative movement of the laser irradiation device 200 with respect to the first raw board 10 or the second raw board 20C is relatively simple and laser processing is easy as compared with cases of other pattern shapes, it is preferred that the pattern shape be i) a shape in which a plurality of polygons of the same shape and the same size are regularly arranged, or viii) a lattice shape. In this case, it is only necessary that the laser be scanned in two directions, i.e., a vertical direction and a horizontal direction, which facilitates the laser processing and facilitates designing of curvature control and shape control of the first substrate 12B or 12C or the second substrate 22C.

Here, it is preferred that a pitch of lines forming the pattern of the lattice shape be in a range of 50 μm to 2,000 μm, and it is more preferred that the pitch be in a range of 100 μm to 1,000 μm. By setting the pitch to be 50 μm or more, time necessary for the laser processing can be prevented from becoming longer than necessary. Further, by setting the pitch to be 2,000 μm or less, the first substrate 12B or 12C or the second substrate 22C to be used in the joining step can be easily appropriately warped so that the mirror surface 10M or 20M warps outward.

FIG. 10 are plan views illustrating exemplary arrangement pattern shapes of the heat denatured layer 60 with respect to the plane direction of the first substrate 12B or 12C or the second substrate 22C, and specifically, illustrate exemplary arrangement pattern shapes of the heat denatured layer 60 when it is assumed that the first substrate 12B or 12C or the second substrate 22C has a circular shape with an orientation flat surface in plan view. As illustrated in FIG. 10, the arrangement pattern shape of the heat denatured layer 60 is, for example, a striped shape obtained by forming a plurality of lines so as to be perpendicular to or in parallel to an orientation flat surface of the first substrate 12B or 12C or the second substrate 22C (FIG. 10(A) and FIG. 10(B)), a lattice shape that is a combination thereof (FIG. 10(C)), or the like. Further, as other arrangement pattern shapes, there are given a shape in which a plurality of regular hexagons of the same size are regularly arranged so that every vertex of a regular hexagon is coincident with any one of vertices of regular hexagons adjacent thereto (FIG. 10(D)), a concentrically circular shape (FIG. 10(E)), and the like. Note that, a width W in FIG. 10(A) means the pitch between lines.

A material of at least one substrate (raw board) selected from the first substrate 12 and the second substrate 22 (or the first raw board 10 and the second raw board 20C) is not specifically limited. A publicly known solid material can be used insofar as the material is a solid material that can be processed or formed into a substrate, and, an inorganic material such as ceramics, glass, and a metal, or a resin material such as an acrylic resin can be used. Further, when the first substrate 12 (or the first raw board 10) or the second substrate 22 (or the second raw board 20C) is formed of a crystalline material, the first substrate 12 (or the first raw board 10) or the second substrate 22 (or the second raw board 20C) may be a single crystalline substrate such as a sapphire substrate, or may be a polycrystalline substrate. Note that, as a material of at least one substrate (raw board) selected from the first substrate 12 and the second substrate 22 (or the first raw board 10 and the second raw board 20C), sapphire, a nitride semiconductor, Si, GaAs, quartz, SiC, and diamond are more preferred, and those materials are also suitable for forming the heat denatured layer 60 by laser irradiation.

Shapes of the first substrate 12 (or the first raw board 10) and the second substrate 22 (or the second raw board 20C) in the plane direction are not specifically limited, and, for example, may be square or the like. However, from the viewpoint of easy application to a production line of publicly known elements of various kinds, it is preferred that the shapes be circular, and it is particularly preferred that the shapes be a circle with an orientation flat surface or a notch formed therein.

When the shape of at least one substrate (raw board) selected from the first substrate 12 and the second substrate 22 (or the first raw board 10 and the second raw board 20C) is circular, or a circle with an orientation flat surface or a notch formed therein, the at least one substrate (raw board) selected from the first substrate 12 and the second substrate 22 (or the first raw board 10 and the second raw board 20C) has a diameter of preferably 50 mm or more, more preferably 75 mm or more, and further preferably 100 mm or more. Note that, when the diameter is 100 mm or more, the warpage of the first raw board 10 or the second raw board 20C is liable to be larger. Therefore, if the first raw board 10 or the second raw board 20C is used as it is in the joining, the void V is more liable to appear on the joined interface. However, by carrying out the joining step using the deformed first substrate 12 or second substrate 22, such a problem can be avoided. Note that, an upper limit value of the diameter is not specifically limited, but, from a practical viewpoint, it is preferred that the diameter be 450 mm or less.

Further, a thickness of at least one substrate (raw board) selected from the first substrate 12 and the second substrate 22 (or the first raw board 10 and the second raw board 20C) is not specifically limited, and can be appropriately selected in accordance with the usage of the composite substrate 30. However, from the viewpoint of securing rigidity of the first raw board 10 or the second raw board 20C and easily carrying out the first raw board deforming step or the second raw board deforming step, it is preferred that the thickness be in a range of about 0.2 mm to 2.0 mm Note that, in the case where the composite substrate 30 is used to manufacture various kinds of elements such as a semiconductor element, when it is necessary to grind the rough surface 10R or 20R, from the viewpoint of reducing a grinding margin to improve the productivity, it is more preferred that the thickness of at least one substrate (raw board) selected from the first substrate 12 and the second substrate 22 (or the first raw board 10 and the second raw board 20C) be 1.5 mm or less. Further, when the first raw board 10 or the second raw board 20C is deformed by forming the heat denatured layer 60 by laser irradiation, from the viewpoint of securing a sufficient region for forming the heat denatured layer 60, it is more preferred that the thickness of at least one substrate (raw board) selected from the first substrate 12 and the second substrate 22 (or the first raw board 10 and the second raw board 20C) be 0.4 mm or more.

(Semiconductor Element Manufacturing Method and Semiconductor Element)

The composite substrate 30 manufactured by the composite substrate manufacturing method of this embodiment may be used as it is as a finished product, or, the composite substrate 30 may undergo further post-processing to manufacture various kinds of products such as a semiconductor element. When various kinds of semiconductor elements such as a light emitting element, a photoelectric conversion element, a memory element, and a transistor are manufactured from the composite substrate 30, by at least carrying out a thin film forming step of forming a thin film including one or more semiconductor layers on at least one surface of the composite substrate 30, a semiconductor element including the first substrate 12, the second substrate 22 joined to the first substrate 12, and the thin film including the one or more semiconductor layers can be manufactured. Note that, the thin film can be formed on any one or both of the surfaces of the composite substrate 30. In this case, the thin film may be formed on, after the first substrate 12 and the second substrate 22 are joined to each other, the non-joining surface(s) of the first substrate 12 and/or the second substrate 22 after being ground. Further, the thin film to be formed on one surface or both surfaces of the composite substrate 30 (including the cases where the surface(s) is/are ground after the composite substrate 30 is manufactured) may be a single-layer film formed of only one semiconductor layer, but in general, it is preferred that the thin film be a multilayer film including one or more semiconductor layers. The layer structure of the multilayer film is appropriately selected in accordance with the usage and the kind of the semiconductor element. Note that, when a layer other than a semiconductor layer is included in the multilayer film, such a layer may be, for example, a base layer, an intermediate layer, an electrode layer, or a protective layer.

Figure 11A:
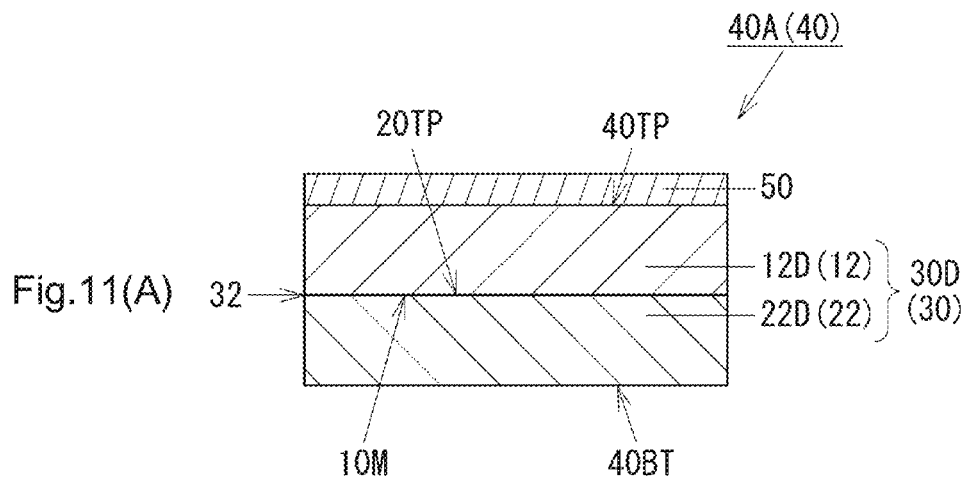
FIG. 11(A) is a view illustrating a semiconductor element in which a thin film including a semiconductor layer is formed on a surface of the composite substrate on the first substrate side.
Figure 11B:
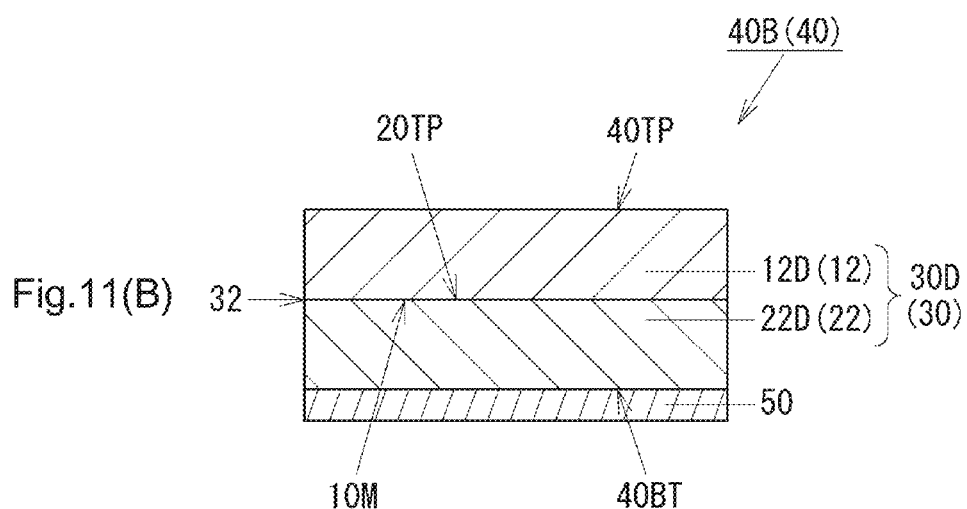
FIG. 11(B) is a view illustrating a semiconductor element in which a thin film including a semiconductor layer is formed on a surface of the composite substrate on the second substrate side.

FIG. 11 are schematic sectional views illustrating exemplary semiconductor elements manufactured using the composite substrate 30 of this embodiment. Here, a semiconductor element 40A (40) illustrated in FIG. 11(A) includes a composite substrate 300D (30) including a first substrate 12D (12) and a second substrate 22D (22), and a thin film 50 formed on one surface (first surface 40TP, surface on the first substrate 12 side) of the composite substrate 30D. Further, a semiconductor element 40B (40) illustrated in FIG. 11(B) includes the composite substrate 30D and the thin film 50 formed on the other surface (second surface 40BT, surface on the second substrate 22 side) of the composite substrate 30D. Here, the thin film 50 includes at least one or more semiconductor layers. The first surface 40TP is a surface of the first substrate 12D that is opposite to the joining surface (minor surface 10M) to which the second substrate 22D is joined. On the other hand, the second surface 40BT is a surface of the second substrate 22D that is opposite to the joining surface 20TP to which the first substrate 12D is joined.

Note that, the first surface 40TP may be a rough surface or a minor surface before the thin film 50 is formed, or may be a surface that is formed by minor polishing or etching the rough surface before the thin film 50 is formed. Further, when the first substrate 12B having the heat denatured layer 60 formed therein is used as the first substrate 12D included in the composite substrate 30D, minor polishing or etching of the rough surface 10R may be carried out until the heat denatured layer 60 is completely removed, or may be carried out to the extent that the heat denatured layer 60 is not removed. Further, the second surface 40BT may be the non-joining surface 20BT itself, or may be a surface that is formed by minor polishing or etching the non-joining surface 20BT. Note that, when the second substrate 22C having the heat denatured layer 60 formed therein is used as the second substrate 22D included in the composite substrate 30D, mirror polishing or etching of the rough surface 20R (corresponding to the second surface 40BT in FIG. 11) may be carried out until the heat denatured layer 60 is completely removed, or may be carried out to the extent that the heat denatured layer 60 is not removed.

Further, as the first substrate 12D or the second substrate 22D in FIG. 11, a substrate having both minor polished surfaces may be used.

Note that, in manufacturing the semiconductor element 40A or 40B, the thin film 50 may be a) a film formed in advance on one surface of the first raw board 10, the second raw board 20C, or the second substrate 22D, b) a film formed on one surface (minor surface 10M) of the first substrate 12D after the first raw board deforming step, or c) a film formed on one surface (joining surface 20TP) of the second substrate 22D after the second raw board deforming step.

Note that, in manufacturing the composite substrate 30D included in the semiconductor element 40A or 40B illustrated in FIG. 11, instead of carrying out the joining step of joining the protruding surface of the first substrate 12 and one surface of the second substrate 22 to each other, a joining step of joining the protruding surface of the first substrate 12 and one surface of the second substrate 22 to each other through intermediation of the thin film 50 may be carried out. In this case, the thin film forming step of forming the thin film 50 on any one of the first surface 40TP and the second surface 40BT can be omitted. Further, steps other than those can be similar to those in the case of the manufacture of the semiconductor element 40A or 40B.

Figure 12:
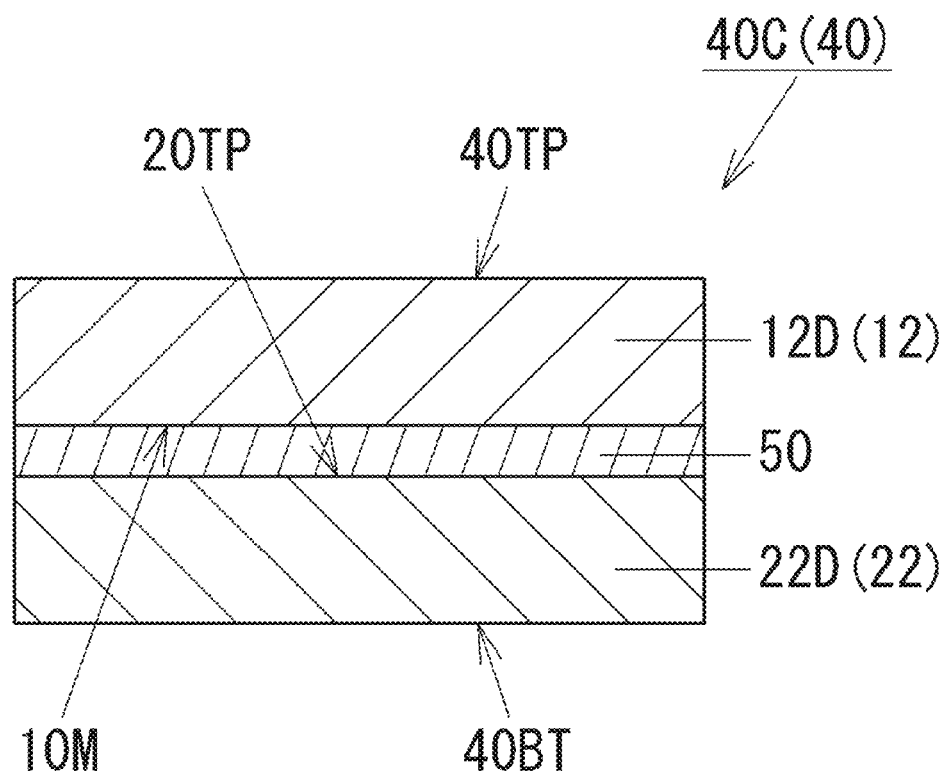
FIG. 12 is a schematic sectional view illustrating an exemplary semiconductor element of a second embodiment of the present invention.

In this case, as illustrated in FIG. 12, a semiconductor element 40C (40) can be obtained, which includes at least the first substrate 12D, the second substrate 22D, and the thin film 50, in which one surface of the first substrate 12D and one surface of the second substrate are joined to each other through intermediation of the thin film 50, and in which the one surface of the first substrate 12D is the mirror surface 10M. The semiconductor element 40C illustrated in FIG. 12 has a structure substantially similar to that of the semiconductor element 40A or 40B except that the thin film 50 formed on the first surface 40TP of the semiconductor element 40A or on the second surface 40BT of the semiconductor element 40B illustrated in FIG. 11 is arranged between the first substrate 12D and the second substrate 22D.

Note that, the semiconductor element 40C illustrated in FIG. 12 as it is may be used for manufacturing various kinds of semiconductor devices, but any one of the first substrate 12D and the second substrate 22D may be removed by applying a substrate separating step such as laser lift-off or wet etching to the semiconductor element 40C. For example, after the thin film 50 is formed on one surface (mirror surface 10M) of the first substrate 12D, the first substrate 12D with the film is used to manufacture the semiconductor element 40C. After that, by carrying out the substrate separating step described above on the semiconductor element 40C, the first substrate 12D is removed. In this case, the thin film 50 formed at first on the one surface of the first substrate 12D can be moved onto the one surface of the second substrate 22D. Therefore, the semiconductor element 40C can be used in a wider range of usage as compared with the semiconductor elements 40A and 40B.

In manufacturing the semiconductor element 40C, the thin film 50 is a) formed in advance on one surface of the first raw board 10, the second raw board 20C, or the second substrate 22D, b) formed on one surface (mirror surface 10M) of the first substrate 12D after the first raw board deforming step, or c) formed on one surface (joining surface 20TP) of the second substrate 22D after the second raw board deforming step.

Note that, as a semiconductor material forming a semiconductor layer included in the thin film 50, a publicly known semiconductor material can be used in accordance with the usage and the kind of the semiconductor element 40, and, for example, a Si-based semiconductor, a nitride-based semiconductor such as GaN and GaAs, a SiC-based semiconductor, or the like can be used. Of those, as a material forming the semiconductor layer, a nitride-based semiconductor is suitable, and particularly suitable when the semiconductor element 40 is used to manufacture an LED element. Further, when the semiconductor element is to be manufactured, it is preferred that a sapphire substrate, a Si substrate, or the like be used as the first substrate 12D and/or the second substrate 22D. Further, when at least a Si-based semiconductor is used as a semiconductor material forming a semiconductor layer, it is particularly preferred that a sapphire substrate be used as the first substrate 12D and/or the second substrate 22D.

An example of the present invention is described below, but the present invention is by no means limited to the following Example. In this example, the first substrate and the second substrate described in the following were used to manufacture the composite substrate in accordance with the procedure illustrated in FIG. 1.

EXAMPLE

—First Substrate and Second Substrate—

As the first substrate 12A and the second substrate 22A, a circular flat substrate having an orientation flat surface formed therein and having a diameter of 50.8 mm was used. Further, the first substrate 12A had a thickness of 0.43 mm, and the second substrate 22A had a thickness of 0.28 mm Further, as the first substrate 12A, a substrate formed of sapphire was used, and, as the second substrate 22A, a substrate formed of Si was used.

One surface of the first substrate 12A was the mirror surface 10M while the other surface was the rough surface 10R. The mirror surface 10M warped outward. The mirror surface 10M had a surface roughness as an arithmetic mean roughness Ra of 0.05 nm, and the ratio of the arithmetic mean roughness Ra of the rough surface 10R (Ra(10R)) to the arithmetic mean roughness Ra of the mirror surface 10M (Ra(10M)), i.e., Ra(10R)/Ra(10M), was 24,000.

On the other hand, both surfaces (joining surface 20TP and non-joining surface 20BT) of the second substrate 22A were substantially flat surfaces. Note that, to be precise, the joining surface 20TP slightly warped inward, and the curvature thereof was 4.6 km$^{-1}$. The joining surface 20TP was a mirror surface having an arithmetic mean roughness Ra of 0.3 nm. On the other hand, the non-joining surface 20BT was a rough surface having an arithmetic mean roughness Ra of 2.5 μm.

—Conditions for Forming Heat Denatured Layer in First Substrate—

Note that, the first substrate 12A described above was manufactured in accordance with the following procedure. First, as the first raw board 10B, a raw board was prepared which had the mirror surface 10M warping inward as illustrated in FIG. 4 with a curvature of 21.7 km$^{-1}$. Next, as processing for changing the balance of internal stress in the thickness direction of the first raw board 10B, as illustrated in FIG. 5, laser was applied into the region R1 on the mirror surface 10M side of the two regions R1 and R2 in the thickness direction of the first raw board 10B to form the heat denatured layer 60, thereby performing processing for spontaneously deforming the first raw board 10B. The first raw board 10B after the deformation was completed (that is, the first substrate 12A) had a curvature of 16.2 km$^{-1}$ or more. The irradiation conditions of the laser were set as follows.

Figure 10A:
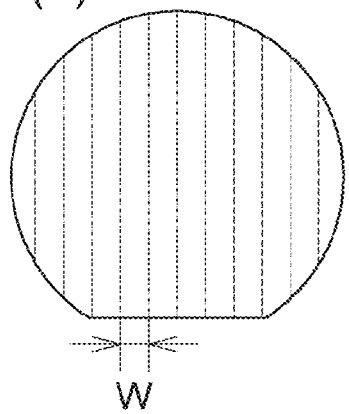
FIG. 10(A) is a plan view illustrating a striped shape in which a plurality of lines are formed perpendicularly to orientation flat surfaces of the first substrate and the second substrate.
Figure 10B:
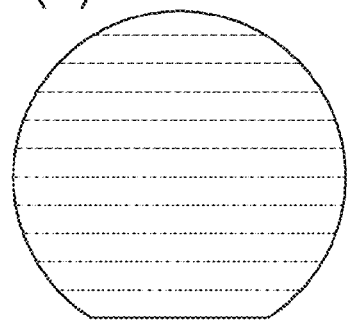
FIG. 10(B) is a plan view illustrating a striped shape in which a plurality of lines are formed in parallel to the orientation flat surfaces of the first substrate and the second substrate.
Figure 10C:
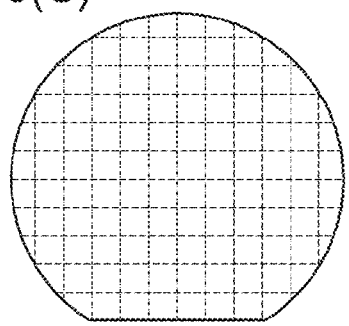
FIG. 10(C) is a plan view illustrating a lattice shape that is a combination of the arrangement pattern shapes illustrated in FIG. 10(A) and FIG. 10(B)
Figure 10D:
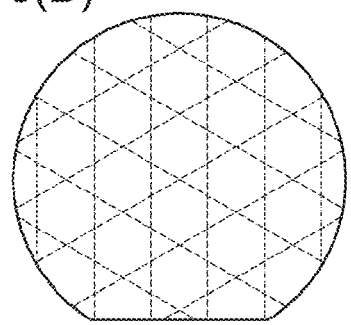
FIG. 10(D) is a plan view illustrating a shape in which a plurality of regular hexagons of the same size are regularly arranged so that every vertex of a regular hexagon is coincident with any one of vertices of regular hexagons adjacent thereto.
Figure 10E:
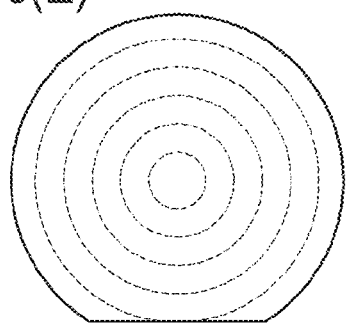
FIG. 10(E) is a plan view illustrating a concentrically circular shape.

Laser Wavelength: 1,045 nm
Pulse Width: 500 fs
Repetition Frequency: 100 kHz
Laser Power: 0.3 W
Laser Spot Size: 1.6 µm to 3.5 µm
Sample Stage Scan Speed: 400 mm/s Further, the heat denatured layer 60 had a pattern shape of a lattice as illustrated in FIG. 10(C), and the pitch of lines of the heat denatured layer 60 was set to be 100 µm.

—Conditions for Joining First Substrate and Second Substrate and Joining Step—

The first substrate 12A and the second substrate 22A were joined by metallization using Au to manufacture an evaluation sample. A Au film was formed by sputtering.

When joining by metallization using Au was carried out, after the first substrate 12A and the second substrate 22A were cleaned, a Au film was formed by sputtering, and then, the joining by metallization was carried out. In this case, a Au film was formed both on the mirror surface 10M of the first substrate 12A and on the joining surface 20TP of the second substrate 22A. The first substrate 12A and the second substrate 22A were joined to each other under a depressurized environment.

As illustrated in FIG. 1(A), the joining step was started by bringing a substantially center portion of the minor surface 10M and a substantially center portion of the joining surface 20TP into contact with each other, and the contact region was caused to spread from the center portion side to the peripheral portion side of the first substrate 12A and the second substrate 22A. Further, at the time when the joining step was completed, the entire mirror surface 10M and the entire joining surface 20TP were brought into contact with each other to be joined as illustrated in FIG. 1(B), and were held under a state of being pressurized with the temperature being raised. Further, after cooling was carried out, the pressurization was released and purged to obtain the composite substrate 30A.

(Result of Evaluation)

—Evaluation of State of Appearance of Void on Joined Interface—

Figure 15:
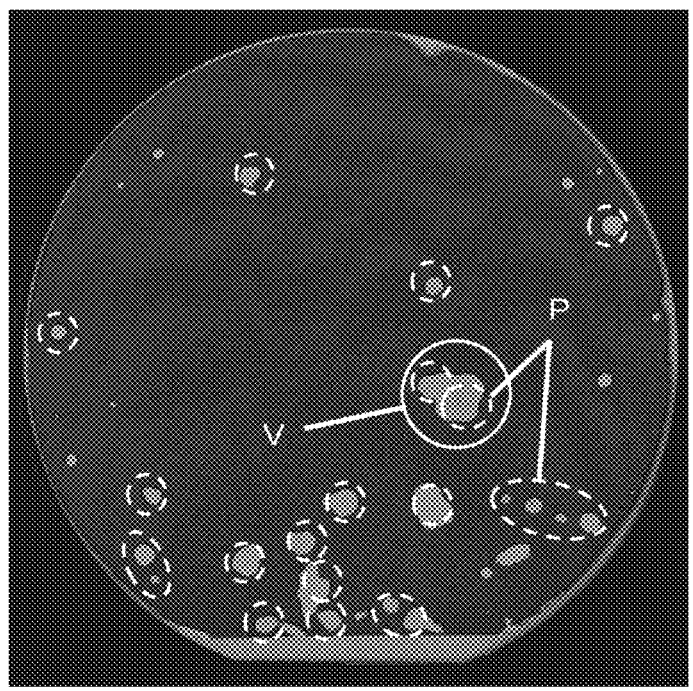
FIG. 15 is a SAM picture showing a joined interface of the composite substrate joined by Au joining of an example of the present invention.

A state of appearance of the void V on the joined interface 32 of the composite substrate 30A was observed using SAM with regard to respective methods of the joining FIG. 15 is a scanning acoustic microscope (SAM) picture of the joined interface 32 by Au joining It was found from FIG. 15 that the void V appeared to some extent on the joined interface 32 of the composite substrate 30A of this example. As a result of further detailed observation of the respective voids V, it was found that particles P existed in most of the voids V, as shown by dashed line circles or dashed line ellipses in FIG. 15. Therefore, the conclusion was that the respective voids V did not appear due to the shapes of the joining surfaces of the first substrate 12A and the second substrate 22A but appeared because the particles that remained on or entered the joined interface 32 were entangled when the joining was carried out.

COMPARATIVE EXAMPLE

Next, a comparative example is described. In this comparative example, the first substrate and the second substrate described in the following were used to manufacture the composite substrate in accordance with the procedure illustrated in FIG. 13(A).

—First Substrate and Second Substrate—

As the first substrate 110A and the second substrate 120, a circular flat substrate having an orientation flat surface formed therein and having a diameter of 50.8 mm was used. Further, the first substrate 110A had a thickness of 0.43 mm, and the second substrate 120 had a thickness of 0.28 mm Further, as the first substrate 110A, a substrate formed of sapphire was used, and, as the second substrate 120, a substrate formed of Si was used.

One surface of the first substrate 110A was a mirror surface 110MP while the other surface was a rough surface 110RP. The mirror surface 110MP warped outward. The first substrate 110A had a curvature of 7.3 km$^{-1}$. Further, the minor surface 110MP had a surface roughness as an arithmetic mean roughness Ra of 0.05 nm, and the ratio of the arithmetic mean roughness Ra of the rough surface 110RP (Ra(110RP)) to the arithmetic mean roughness Ra of the minor surface 110MP (Ra(110MP)), i.e., Ra(110RP)/Ra(110MP), was 24,000.

On the other hand, both surfaces of the second substrate 120 were substantially flat surfaces, and the surface to be joined to the mirror surface 110MP was a mirror surface having an arithmetic mean roughness Ra of 0.3 nm. On the other hand, the surface not to be joined was a rough surface having an arithmetic mean roughness Ra of 2.5 µm.

—Conditions for Joining First Substrate and Second Substrate and Joining Step—

The first substrate 110A and the second substrate 120 were joined by metallization using Au similarly to the one used in the example described above to manufacture an evaluation sample.

When joining by metallization using Au was carried out, after the first substrate 110A and the second substrate 120 were cleaned, a Au film was formed by sputtering, and then, the joining by metallization was carried out. In this case, a Au film was formed both on the mirror surface 110MP of the first substrate 110A and on the joining surface of the second substrate 120. The first substrate 110A and the second substrate 120 were joined to each other under a depressurized environment similarly to the example.

As illustrated in FIG. 13(A), the joining step was carried out under a state in which the mirror surface 110MP was the joining surface. Further, at the time when the joining step was completed, pressurization was carried out and the temperature was raised, and the state was maintained. Further, after cooling was carried out, the pressurization was released and purged to obtain the composite substrate. Note that, conditions for the pressurization and the heating when the joining was carried out were the same as those in the example.

(Result of Evaluation)

—Evaluation of State of Appearance of Void on Joined Interface—

Figure 16:
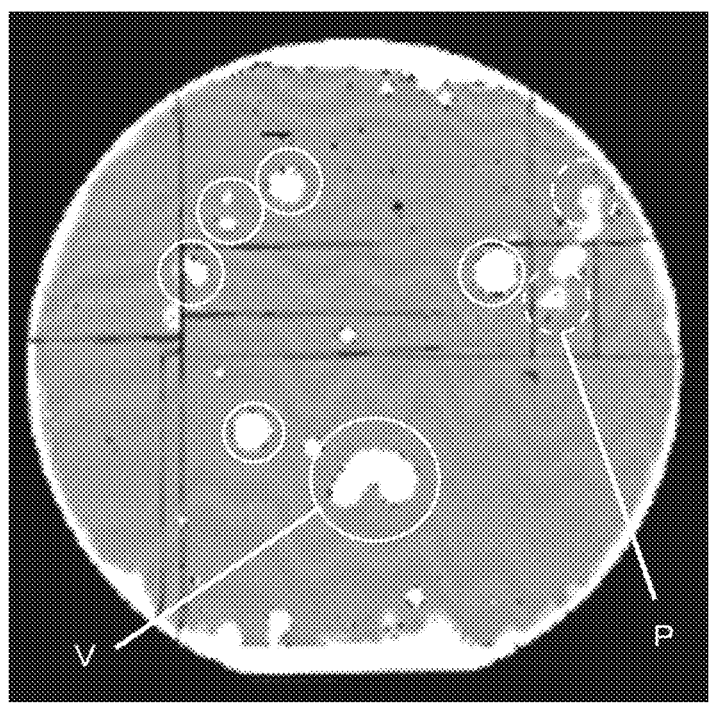
FIG. 16 is a SAM picture showing a joined interface of the composite substrate joined by Au joining of a comparative example.

A state of appearance of the void V on the joined interface of the manufactured composite substrate was observed using SAM with regard to respective methods of the joining FIG. 16 is a SAM picture of the joined interface by AU joining.

It was found from FIG. 16 that the void V appeared on the joined interface of the comparative example. As a result of further detailed observation of the respective voids V, it was concluded that the voids V at two places shown by dashed line circles in FIG. 16 appeared, similarly to the case of the example described above, because the particles P remained on or entered the joined interface. However, with regard to most of the voids V other than those, which are shown by solid line circles, no existence of the particle was found therein, and thus, it was confirmed that the voids appeared because air was entangled due to the shape of the recessed surface of the mirror surface 110 MP as the joining surface.

On the other hand, as described above, in this example illustrated in FIG. 15, it was made clear that the respective voids V appeared because the particles that remained on or entered the joined interface 32 were entangled when the joining was carried out and did not appear due to the shapes of the joining surfaces of the first substrate 12A and the second substrate 22A. Therefore, by comparison between FIG. 15 and FIG. 16, it was confirmed that, in this example described above, appearance of the voids V because of entangled air due to the shapes of the joining surfaces was inhibited.

Note that, in the SAM picture shown in FIG. 16, vertical and horizontal straight lines are cracks appeared in the first substrate 110A. Those cracks appeared only in the first substrate 110A, and did not develop on the mirror surface 110MP as the joining surface. Therefore, those cracks do not affect appearance of the voids V on the joined interface.

The invention claimed is:

1. A composite substrate, comprising:
a first substrate; and
a second substrate,
one surface of the first substrate and one surface of the second substrate being joined to each other,
the one surface of the first substrate being a mirror surface,
wherein a heat denatured layer is formed in at least one region selected from a region on a side of the surface joined to the second substrate of two regions formed by dividing the first substrate into two in a thickness direction, and a region on a side of the surface joined to the first substrate of two regions formed by dividing the second substrate into two in a thickness direction, and
wherein a maximum length of the heat-denatured layer in the direction that is parallel to the surface of the first substrate is larger than a maximum length of the heat-denatured layer in the thickness direction of the first substrate.

2. A composite substrate according to claim 1, wherein the one surface of the second substrate is a mirror surface.

3. A semiconductor element, comprising:
a first substrate;
a second substrate; and
a thin film comprising one or more semiconductor layers,
one surface of the first substrate and one surface of the second substrate being joined to each other,
the thin film being formed on at least one surface selected from a surface of the first substrate opposite to a surface to which the second substrate is joined, and a surface of the second substrate opposite to a surface to which the first substrate is joined,
the one surface of the first substrate being a mirror surface,
wherein a heat denatured layer is formed in at least one region selected from a region on a side of the surface joined to the second substrate of two regions formed by dividing the first substrate into two in a thickness direction, and a region on a side of the surface joined to the first substrate of two regions formed by dividing the second substrate into two in a thickness direction, and
wherein a maximum length of the heat-denatured layer in the direction that is parallel to the surface of the first substrate is larger than a maximum length of the heat-denatured layer in the thickness direction of the first substrate.

4. A semiconductor element, comprising:
a first substrate;
a second substrate; and
a thin film comprising one or more semiconductor layers,
one surface of the first substrate and one surface of the second substrate being joined to each other through intermediation of the thin film,
the one surface of the first substrate being a mirror surface,
wherein a heat denatured layer is formed in at least one region selected from a region on a side of the surface joined to the second substrate of two regions formed by dividing the first substrate into two in a thickness direction, and a region on a side of the surface joined to the first substrate of two regions formed by dividing the second substrate into two in a thickness direction, and
wherein a maximum length of the heat-denatured layer in the direction that is parallel to the surface of the first substrate is larger than a maximum length of the heat-denatured layer in the thickness direction of the first substrate.

5. A semiconductor element according to claim 3, wherein the one surface of the second substrate is a mirror surface.

6. A semiconductor element according to claim 3, wherein the thin film comprises at least one nitride semiconductor layer.

* * * * *